(12) United States Patent
Arima et al.

(10) Patent No.: US 10,992,225 B2
(45) Date of Patent: Apr. 27, 2021

(54) CHARGE PUMP CIRCUIT

(71) Applicant: Sony Semiconductor Solutions Corporation, Kanagawa (JP)

(72) Inventors: Daisuke Arima, Fukuoka (JP); Yasuhide Shimizu, Fukuoka (JP); Kazuki Goto, Fukuoka (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/964,445

(22) PCT Filed: Jan. 16, 2019

(86) PCT No.: PCT/JP2019/000989
§ 371 (c)(1),
(2) Date: Jul. 23, 2020

(87) PCT Pub. No.: WO2019/150942
PCT Pub. Date: Aug. 8, 2019

(65) Prior Publication Data
US 2021/0050775 A1    Feb. 18, 2021

(30) Foreign Application Priority Data
Jan. 30, 2018    (JP) .............................. JP2018-013515

(51) Int. Cl.
*G05F 1/10*    (2006.01)
*G05F 3/02*    (2006.01)
*H02M 3/07*    (2006.01)
*H03L 7/089*   (2006.01)

(52) U.S. Cl.
CPC ............ *H02M 3/07* (2013.01); *H03L 7/0895* (2013.01)

(58) Field of Classification Search
CPC .............................. H02M 3/07; H03L 7/0895
USPC ......................................................... 327/536
See application file for complete search history.

(56) References Cited

U.S. PATENT DOCUMENTS 6,445,211 B1 * 9/2002 Saripella ............... H03L 7/0895
326/33
7,130,225 B1   10/2006 Terrovitis

FOREIGN PATENT DOCUMENTS

| JP | 62-234415 A | 10/1987 |
| JP | 2002-330067 A | 11/2002 |

* cited by examiner

*Primary Examiner* — Metasebia T Retebo
(74) *Attorney, Agent, or Firm* — Michael Best & Friedrich LLP

(57) ABSTRACT

The present technology relates to a charge pump circuit that enables reduction of a circuit area.
Provided is a charge pump circuit including: a first transistor; a second transistor to which a constant current is supplied; a third transistor connected to the first transistor and a voltage source; a fourth transistor group including N transistors arranged in a cascade on the first transistor side, the N transistors all including control terminals connected to the second transistor; a fifth transistor group including N transistors arranged in a cascade on the second transistor side, the N transistors all including control terminals connected to the second transistor; a first switch that connects the first transistor to the second transistor; a second switch that connects the first transistor to a ground node; a third switch that connects the third transistor to the fifth transistor group; and a fourth switch that connects the third transistor to the ground node.

10 Claims, 19 Drawing Sheets

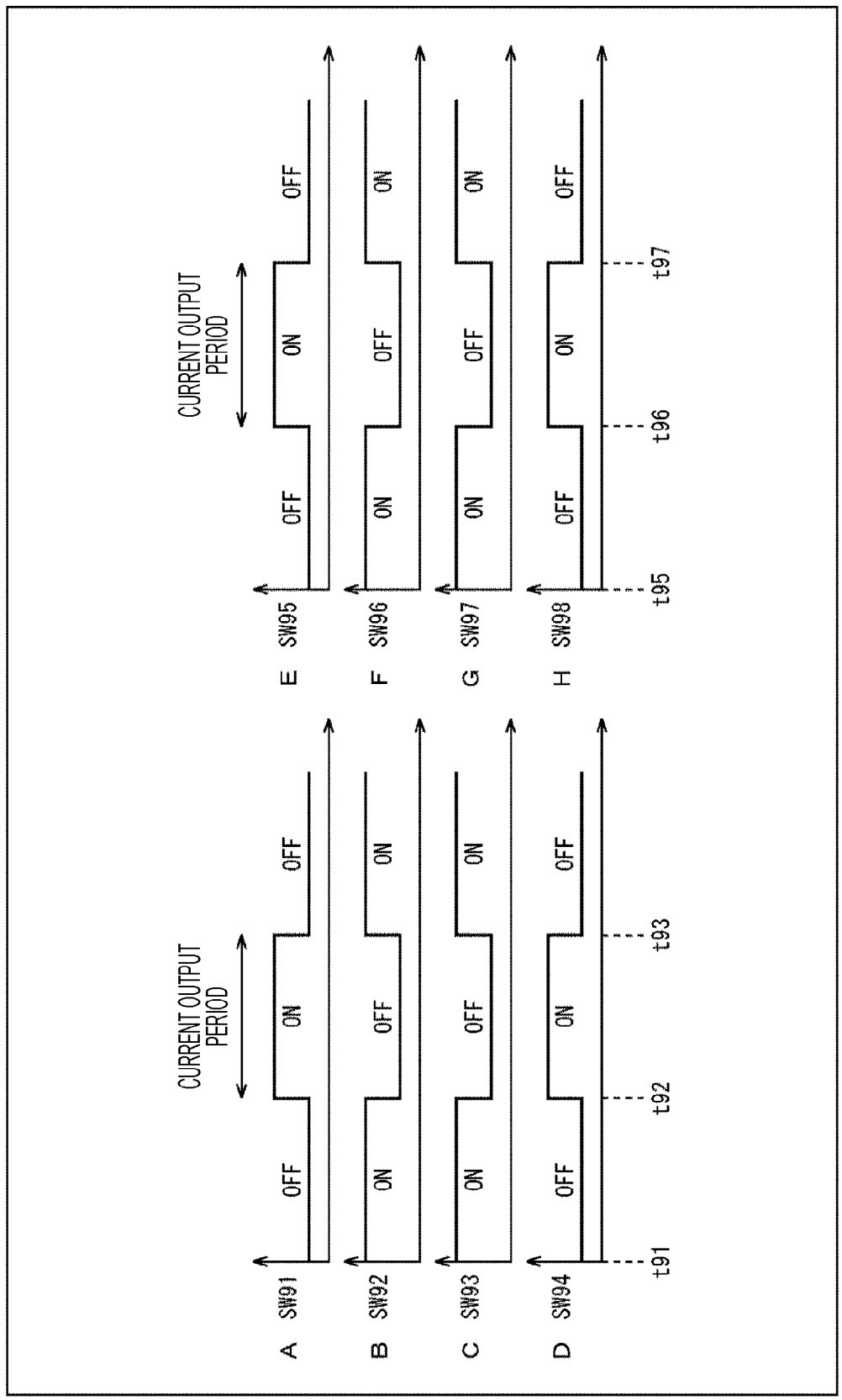

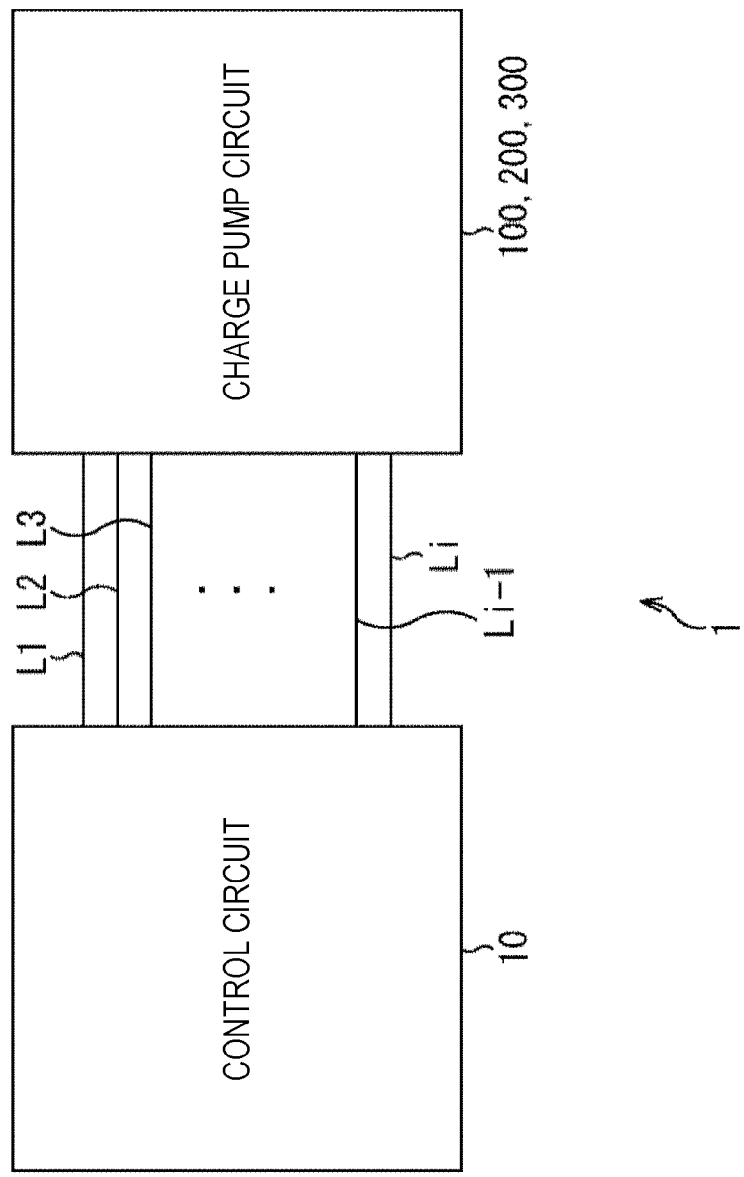

CHARGE PUMP CIRCUIT

TECHNICAL FIELD

The present technology relates to a charge pump circuit, and particularly to a charge pump circuit enabled to reduce a circuit area.

BACKGROUND ART

In a Phase Locked Loop (PLL) circuit and the like, a charge pump circuit is used. As a configuration of the charge pump circuit, for example, a gate switching type configuration is known (for example, see Patent Document 1).

CITATION LIST

Patent Document

Patent Document 1: Japanese Patent Application Laid-Open No. 62-234415

SUMMARY OF THE INVENTION

Problems to be Solved by the Invention

By the way, the gate switching type charge pump circuit can operate at a low voltage, but it is necessary to arrange a sufficiently large capacitance to suppress a decrease in a current value, and a circuit area increases. A technology for suppressing the increase in the circuit area has therefore been required in the charge pump circuit.

The present technology has been made in view of such a situation, and it is intended to enable reduction of the circuit area.

Solutions to Problems

A charge pump circuit according to a first aspect of the present technology is a charge pump circuit including: a first transistor including a first terminal, a second terminal connected to an output terminal, and a control terminal; a second transistor including a first terminal, a second terminal to which a constant current is supplied, and a control terminal connected to the second terminal; a third transistor including a first terminal connected to the first terminal of the first transistor, a second terminal connected to a voltage source that supplies an arbitrary voltage, and a control terminal; a fourth transistor group including N transistors arranged in a cascade on a first terminal side of the first transistor, where N is an integer greater than or equal to 1, the N transistors all including control terminals connected to the control terminal of the second transistor; a fifth transistor group including N transistors arranged in a cascade on a first terminal side of the second transistor, the N transistors all including control terminals connected to the control terminal of the second transistor; a first switch element that electrically connects the control terminal of the first transistor to the control terminal of the second transistor; a second switch element that connects the control terminal of the first transistor to a ground node; a third switch element that electrically connects the control terminal of the third transistor to the control terminals of the fourth transistor group and the fifth transistor group; and a fourth switch element that connects the control terminal of the third transistor to the ground node, in which: the first transistor has a channel width and a channel length identical to those of the second transistor; the third transistor has the channel width and the channel length identical to those of the first transistor and the second transistor; in the fourth transistor group, each of the transistors has the channel width and the channel length identical to those of the second transistor, and a first terminal of one of the transistors is connected to the ground node; and in the fifth transistor group, each of the transistors has the channel width and the channel length identical to those of the second transistor, and a first terminal of one of the transistors is connected to the ground node.

A charge pump circuit according to a second aspect of the present technology is a charge pump circuit including: a first transistor including a first terminal, a second terminal connected to an output terminal, and a control terminal; a second transistor including a first terminal, a second terminal to which a constant current is supplied, and a control terminal connected to the second terminal; a third transistor including a first terminal connected to the first terminal of the first transistor, a second terminal connected to a voltage source that supplies an arbitrary voltage, and a control terminal; a fourth transistor group including N transistors arranged in a cascade on a first terminal side of the first transistor, where N is an integer greater than or equal to 1, the N transistors all including control terminals connected to the control terminal of the second transistor; a fifth transistor group including N transistors arranged in a cascade on a first terminal side of the second transistor, the N transistors all including control terminals connected to the control terminal of the second transistor; a first switch element that electrically connects the control terminal of the first transistor to the control terminal of the second transistor; a second switch element that connects the control terminal of the first transistor to a power supply node; a third switch element that electrically connects the control terminal of the third transistor to the control terminals of the fourth transistor group and the fifth transistor group; and a fourth switch element that connects the control terminal of the third transistor to the power supply node, in which: the first transistor has a channel width and a channel length identical to those of the second transistor; the third transistor has the channel width and the channel length identical to those of the first transistor and the second transistor; in the fourth transistor group, each of the transistors has the channel width and the channel length identical to those of the second transistor, and a first terminal of one of the transistors is connected to the power supply node; and in the fifth transistor group, each of the transistors has the channel width and the channel length identical to those of the second transistor, and a first terminal of one of the transistors is connected to the power supply node.

A charge pump circuit according to a third aspect of the present technology is a charge pump circuit including: a first transistor including a first terminal, a second terminal connected to an output terminal, and a control terminal; a second transistor including a first terminal, a second terminal to which a first constant current is supplied, and a control terminal connected to the second terminal; a third transistor including a first terminal connected to the first terminal of the first transistor, a second terminal connected to a first voltage source that supplies a first voltage, and a control terminal; a fourth transistor group including N transistors arranged in a cascade on a first terminal side of the first transistor, where N is an integer greater than or equal to 1, the N transistors all including control terminals connected to the control terminal of the second transistor; a fifth transistor group including N transistors arranged in a cascade on a first terminal side of the second transistor, the N transistors all including control terminals connected to the control terminal of the second transistor; a first switch element that electrically connects the control terminal of the first transistor to the control terminal of the second transistor; a second switch element that connects the control terminal of the first transistor to a ground node; a third switch element that electrically connects the control terminal of the third transistor to the control terminals of the fourth transistor group and the fifth transistor group; a fourth switch element that connects the control terminal of the third transistor to the ground node; a sixth transistor including a first terminal, a second terminal connected to the output terminal, and a control terminal; a seventh transistor including a first terminal, a second terminal to which a second constant current is supplied, and a control terminal connected to the second terminal; an eighth transistor including a first terminal connected to the first terminal of the sixth transistor, a second terminal connected to a second voltage source that supplies a second voltage, and a control terminal; a ninth transistor group including M transistors arranged in a cascade on a first terminal side of the sixth transistor, where M is an integer greater than or equal to 1, the M transistors all including control terminals connected to the control terminal of the seventh transistor; a tenth transistor group including M transistors arranged in a cascade on a first terminal side of the seventh transistor, the M transistors all including control terminals connected to the control terminal of the seventh transistor; a fifth switch element that electrically connects the control terminal of the sixth transistor to the control terminal of the seventh transistor; a sixth switch element that connects the control terminal of the sixth transistor to a power supply node; a seventh switch element that electrically connects the control terminal of the eighth transistor to the control terminals of the ninth transistor group and the tenth transistor group; and an eighth switch element that connects the control terminal of the eighth transistor to the power supply node, in which: the first transistor has a channel width and a channel length identical to those of the second transistor; the third transistor has the channel width and the channel length identical to those of the first transistor and the second transistor; in the fourth transistor group, each of the transistors has the channel width and the channel length identical to those of the second transistor, and a first terminal of one of the transistors is connected to the ground node; in the fifth transistor group, each of the transistors has the channel width and the channel length identical to those of the second transistor, and a first terminal of one of the transistors is connected to the ground node; the sixth transistor has a channel width and a channel length identical to those of the seventh transistor; the eighth transistor has the channel width and the channel length identical to those of the sixth transistor and the seventh transistor; in the ninth transistor group, each of the transistors has the channel width and the channel length identical to those of the seventh transistor, and a first terminal of one of the transistors is connected to the power supply node; and in the tenth transistor group, each of the transistors has the channel width and the channel length identical to those of the seventh transistor, and a first terminal of one of the transistors is connected to the power supply node.

A charge pump circuit according to a fourth aspect of the present technology is a charge pump circuit including: a current source transistor including a first terminal connected to a ground node, a second terminal connected to an output terminal, and a control terminal; a first switch element that connects the control terminal of the current source transistor to a first signal line to which a first voltage is applied; a second switch element that connects the control terminal of the current source transistor to the ground node; a capacitance element including one electrode connected to the first signal line, and another electrode connectable to a second signal line to which a second voltage is applied or a third signal line to which a difference voltage between the second voltage and the first voltage is applied; a third switch element that connects the other electrode of the capacitance element to the third signal line; and a fourth switch element that connects the other electrode of the capacitance element to the second signal line.

A charge pump circuit according to a fifth aspect of the present technology is a charge pump circuit including: a current source transistor including a first terminal connected to a power supply node, a second terminal connected to an output terminal, and a control terminal; a first switch element that connects the control terminal of the current source transistor to a first signal line to which a difference voltage between a power supply voltage and a first voltage is applied; a second switch element that connects the control terminal of the current source transistor to the power supply node; a capacitance element including one electrode connected to the first signal line, and another electrode connectable to a second signal line to which a second voltage is applied or a third signal line to which a sum voltage of the second voltage and the first voltage is applied; a third switch element that connects the other electrode of the capacitance element to the third signal line; and a fourth switch element that connects the other electrode of the capacitance element to the second signal line.

A charge pump circuit according to a sixth aspect of the present technology is a charge pump circuit including: a first transistor including a first terminal connected to a ground node, a second terminal connected to an output terminal, and a control terminal; a first switch element that connects the control terminal of the first transistor to a first signal line to which a first voltage is applied; a second switch element that connects the control terminal of the first transistor to the ground node; a first capacitance element including one electrode connected to the first signal line, and another electrode connectable to a second signal line to which a second voltage is applied or a third signal line to which a difference voltage between the second voltage and the first voltage is applied; a third switch element that connects the other electrode of the first capacitance element to the third signal line; a fourth switch element that connects the other electrode of the first capacitance element to the second signal line; a second transistor including a first terminal connected to a power supply node, a second terminal connected to the output terminal, and a control terminal; a fifth switch element that connects the control terminal of the second transistor to a fourth signal line to which a difference voltage between a power supply voltage and a third voltage is applied; a sixth switch element that connects the control terminal of the second transistor to the power supply node; a second capacitance element including one electrode connected to the fourth signal line, and another electrode connectable to a fifth signal line to which a fourth voltage is applied or a sixth signal line to which a sum voltage of the fourth voltage and the third voltage is applied; a seventh switch element that connects the other electrode of the second capacitance element to the sixth signal line; and an eighth switch element that connects the other electrode of the second capacitance element to the fifth signal line.

Note that, the charge pump circuits according to the first to sixth aspects of the present technology may be independent devices, or may be internal blocks that constitute one device.

Effects of the Invention

According to the first to sixth aspects of the present technology, the circuit area can be reduced.

Note that, the effect described here is not necessarily limited, and can be any effect described in the present disclosure.

BRIEF DESCRIPTION OF DRAWINGS

FIG. 18 is a timing chart illustrating operation of switches in the example of the third configuration of the charge pump circuit according to the third embodiment.

FIG. 19 is a diagram illustrating an example of a configuration of an electronic circuit system according to a fourth embodiment.

MODE FOR CARRYING OUT THE INVENTION

Hereinafter, embodiments of the present technology are described with reference to the drawings. Note that, the description will be given in the following order.
1. First embodiment: current source vertical stack type
2. Second embodiment: charge canceling type
3. Third embodiment: charge canceling type (including potential generation means)
4. Fourth embodiment: electronic circuit system
5. Modification 1. First Embodiment In a first embodiment, as a charge pump circuit 100, a configuration will be described in which a plurality of vertically stacked transistors is provided on the current source side.

Note that, the charge pump circuit 100 may operate as a current sink (drawing) for current discharge, or may operate as a current source that supplies (injects) a charging current. In the following description, the former is referred to as a "sink-type", and the latter is referred to as a "source-type", and configurations and operations will be described in order of a sink-type charge pump circuit 100A, a source-type charge pump circuit 100B, and a sink/source integrated-type charge pump circuit 100C.

(Circuit Diagram of First Configuration)

Figure 1:
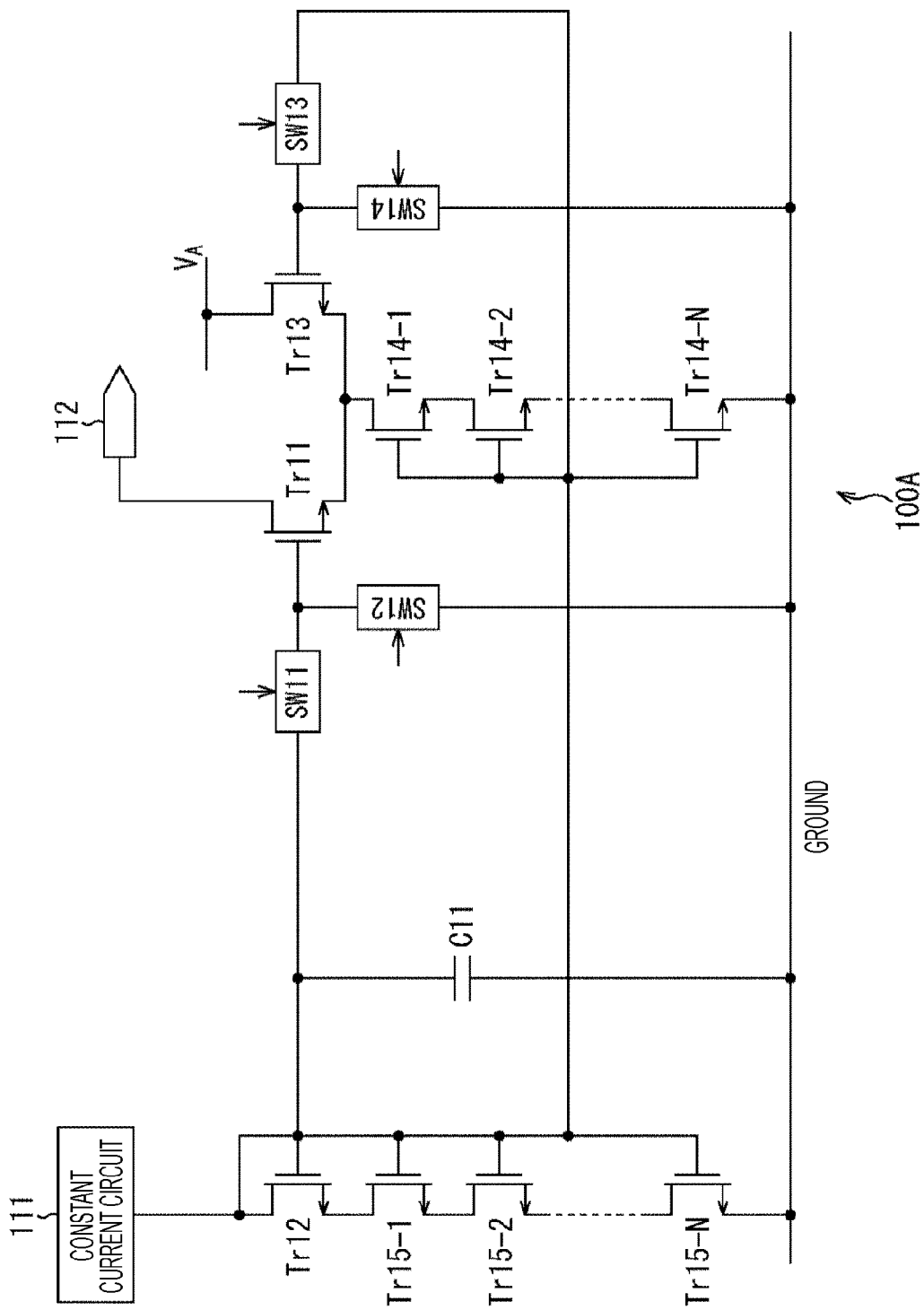
FIG. 1 is a circuit diagram illustrating an example of a first configuration of a charge pump circuit according to a first embodiment.

FIG. 1 is a circuit diagram illustrating an example of a first configuration of the charge pump circuit according to the first embodiment.

In FIG. 1, the sink-type charge pump circuit 100A includes a constant current circuit 111, transistors Tr11, Tr12, Tr13, Tr14-1 to Tr14-N, and Tr15-1 to Tr15-N, switches SW11 to SW14, and capacitance C11. Note that, the transistors Tr11, Tr12, Tr13, Tr14-1 to Tr14-N, and Tr15-1 to Tr15-N can be configured as, for example, N-type MOS transistors.

The transistor Tr11 has the drain connected to an output terminal 112, the source connected to the source of the transistor Tr13, and the gate connected to the switches SW11 and SW12. Furthermore, the N (N: an integer greater than or equal to 1) vertically stacked transistors Tr14-1 to Tr14-N are connected to the source side of the transistor Tr11.

The transistor Tr12 has the drain connected to the constant current circuit 111. Furthermore, the gate of the transistor Tr12 is connected to the drain and the switch SW11. Moreover, the N (N: an integer greater than or equal to 1) vertically stacked transistors Tr15-1 to Tr15-N are connected to the source side of the transistor Tr12, and all the gates of the transistors Tr15-1 to Tr15-N are connected to the gate of the transistor Tr12.

The transistor Tr13 has the drain connected to a voltage source (an arbitrary voltage $V_A$), the source connected to the source of the transistor Tr11, and the gate connected to the switches SW13 and SW14. Furthermore, the N vertically stacked transistors Tr14-1 to Tr14-N are connected to the source side of the transistor Tr13.

The N transistors Tr14-1 to Tr14-N are arranged in a cascade on the source side of the transistors Tr11 and Tr13, and all the gates of the transistors Tr14-1 to Tr14-N are connected to the gate of the transistor Tr12. Note that, the source of the N-th transistor Tr14-N among the vertically stacked transistors Tr14-1 to Tr14-N is connected to a ground node.

The N transistors Tr15-1 to Tr15-N are arranged in a cascade on the source side of the transistor Tr12, and all the gates of the transistors Tr15-1 to Tr15-N are connected to the gate of the transistor Tr12. Note that, the source of the N-th transistor Tr15-N among the vertically stacked transistors Tr15-1 to Tr15-N is connected to the ground node.

Here, the sizes of the transistors Tr in the sink-type charge pump circuit 100A have a relationship as indicated in the following expressions (1) and (2).

$$Tr12=Tr11=Tr13 \qquad (1)$$

$$Tr15=Tr14 \qquad (2)$$

That is, in a case where the channel width (W length) and the channel length (L length) of each transistor Tr can be designed to be arbitrary values, the transistor Tr11 and the transistor Tr13 are made to have the channel width and channel length of the same values as those of the transistor Tr12. That is, the transistor Tr11, the transistor Tr12, and the transistor Tr13 have the same channel width (W length) and channel length (L length).

Furthermore, each transistor Tr14 of the transistors Tr14-1 to Tr14-N and each transistor Tr15 of the transistors Tr15-1 to Tr15-N are made to have the channel width and channel length of the same values as those of the transistor Tr12. That is, the transistors Tr14-1 to Tr14-N and the transistors Tr15-1 to Tr15-N have the same channel width (W length) and channel length (L length).

Note that, it is sufficient that the transistors Tr14-1 to Tr14-N and the transistors Tr15-1 to Tr15-N have the same channel width and channel length not only in a case where they have the same number of multipliers and fingers of the transistors but also in a case where they have the different number of multipliers and fingers of the transistors. That is, for example, for the purpose of improving the relative variation of noise and transistors, there is a case where the number of multipliers or fingers is changed in the transistor Tr12 and the transistor Tr15 although the channel width and the channel length are the same as those of the transistor Tr11 and the transistor Tr14; however, even in such a case, the configuration of the present technology can be adopted.

The switch SW11 has one end connected to the gate of the transistor Tr11, and the other end connected to the gate of the transistor Tr12 and the gates of the transistors Tr15-1 to Tr15-N.

The switch SW11 performs switching operation depending on a control signal input to the switch SW11. When turned on, the switch SW11 electrically connects the gate of the transistor Tr11 to the gates of the transistors Tr12 and Tr15-1 to Tr15-N.

The switch SW12 has one end connected to the gate of the transistor Tr11, and the other end connected to the ground node. The switch SW12 performs switching operation depending on a control signal input to the switch SW12. When turned on, the switch SW12 connects the gate of the transistor Tr11 to the ground node.

The switch SW13 has one end connected to the gate of the transistor Tr13, and the other end connected to the gate of the transistor Tr12, the gates of the transistors Tr15-1 to Tr15-N, and the gates of the transistors Tr14-1 to Tr14-N.

The switch SW13 performs switching operation depending on a control signal input to the switch SW13. When turned on, the switch SW13 electrically connects the gate of the transistor Tr13 to the gate of the transistor Tr12, the gates of the transistors Tr15-1 to Tr15-N, and the gates of the transistors Tr14-1 to Tr14-N.

The switch SW14 has one end connected to the gate of the transistor Tr13, and the other end connected to the ground node. The switch SW14 performs switching operation depending on a control signal input to the switch SW14. When turned on, the switch SW14 connects the gate of the transistor Tr13 to the ground node.

The capacitance C11 has one electrode connected to a signal line between the gate of the transistor Tr12 and the switch SW11, and the other electrode connected to the ground node.

(Operation of First Configuration)

Next, with reference to a timing chart of FIG. 2, operation will be described of the sink-type charge pump circuit 100A illustrated in FIG. 1. In A to D of FIG. 2, levels are illustrated of the control signals input to the switches SW11 to SW14, respectively, and each switch SW performs switching operation depending on the control signal of an H level or a L level.

Figure 2:
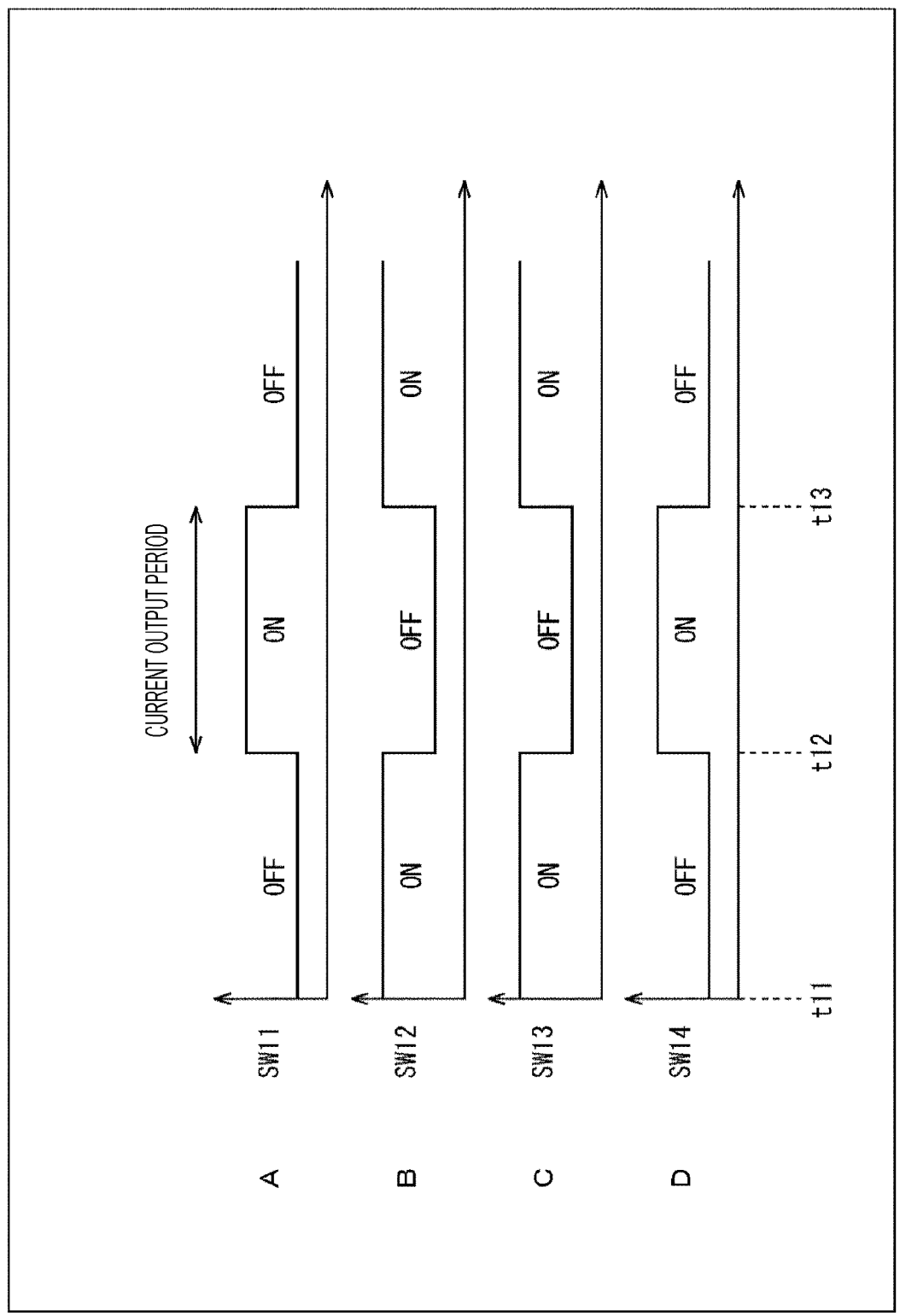
FIG. 2 is a timing chart illustrating operation of switches in the example of the first configuration of the charge pump circuit according to the first embodiment.

In FIG. 2, a period from time t12 to time t13 is a current output period in which a current is output from the output terminal 112. During the current output period, the switches SW11 and SW14 are turned on, and the gate of the transistor Tr11 is electrically connected to the gate of the transistor Tr12 and the gates of the transistors Tr15-1 to Tr15-N, and the gate of the transistor Tr13 is connected to the ground node.

As described above, when the current source is turned on during the current output period, switching control is performed so that the switches SW11 and SW14 are turned on and the switches SW12 and SW13 are turned off, whereby the transistors Tr12 and Tr15-1 to Tr15-N, and the transistor Tr11 and the transistors Tr14-1 to Tr14-N have the same configuration in a state where the current source is turned on, so that it is possible to perform current mirror operation and output an intended current.

Here, the transistor Tr12 and the transistors Tr15-1 to Tr15-N have the same channel width (W: W length) and channel length (L: L length) as those of the transistor Tr11 and the transistors Tr14-1 to Tr14-N, so that if the transistor Tr12 and the transistors Tr15-1 to Tr15-N are combined with the transistor Tr11 and the transistors Tr14-1 to Tr14-N, they behave as a transistor having a characteristic indicated in the following expression (3).

$$W/(N+1)\times L \qquad (3)$$

From the characteristic indicated in the expression (3), it is meant that, in the sink-type charge pump circuit 100A, a current source having a large channel length (L length) in a conventional charge pump circuit is divided into N+1.

Then, in view of the above, since only the transistor Tr11 performs switching, a parasitic capacitance component of the current source gate to which the switch is connected is reduced to 1/(N+1) compared to the current source having the large channel length (L length) in the conventional charge pump circuit. As a result, a capacitance value (a capacitance value of the capacitance C11) for suppressing a decrease in a sink current value due to charge sharing can be reduced to 1/(N+1), so that the circuit area can be greatly reduced.

On the other hand, in FIG. 2, during a period excluding the power output period, that is, during a period from time t11 to time t12 and a period on and after time t13, the switches SW12 and SW13 are turned on, and the gate of the transistor Tr11 is connected to the ground node, and the gate of the transistor Tr13 is electrically connected to the gate of the transistor Tr12, the gates of the transistors Tr15-1 to Tr15-N, and the gates of the transistors Tr14-1 to Tr14-N.

As described above, when the current source is turned off during the period excluding the current output period, switching control is performed so that the switches SW11 and SW14 are turned off and the switches SW12 and SW13 are turned on, whereby the transistor Tr13 and the transistors Tr14-1 to Tr14-N have a current mirror configuration with the transistor Tr12 and the transistors Tr15-1 to Tr15-N in a state where the current source is turned off, so that current steering operation is performed in which an arbitrary current is supplied on an arbitrary voltage side.

As a result, the output current source always outputs a current continuously to the output terminal 112 or to an arbitrary voltage, so that a source voltage of the transistor Tr11 and the transistor Tr13 does not fluctuate, and high-speed current on/off operation can be implemented. Furthermore, since the current is always output continuously, there is an advantage that unnecessary current spurious is not generated in a power supply or a ground, and does not become an aggressor (a circuit that generates noise) to a peripheral circuit.

Note that, in the timing chart of FIG. 2, the timings of turning on/off the switches SW11 to SW14 have been described as being all switched simultaneously at time t12, time t13, and the like for convenience of description; however, the on/off timings of the switches SW11 and SW12 or the on/off timings of the switches SW13 and SW14 are slightly shifted actually, whereby an outflow is suppressed of electric charges due to simultaneous turning on of the switches SW11 and SW12 or simultaneous turning on of the switches SW13 and SW14.

As described above, in the sink-type charge pump circuit 100A, the current mirror source transistor is configured by the N vertically stacked transistors Tr15-1 to Tr15-N and the transistor Tr12, and the output current source side is configured by the N vertically stacked transistors Tr14-1 to Tr14-N, the transistor Tr11 drain-connected to the output side, and the transistor Tr13 whose source is made common to that of the transistor Tr11 and that is drain-connected to the arbitrary voltage ($V_A$). By adopting such a configuration, the capacitance value (the capacitance value of the capacitance C11) arranged in the circuit can be reduced, and as a result, the circuit area can be reduced.

Figure 3:
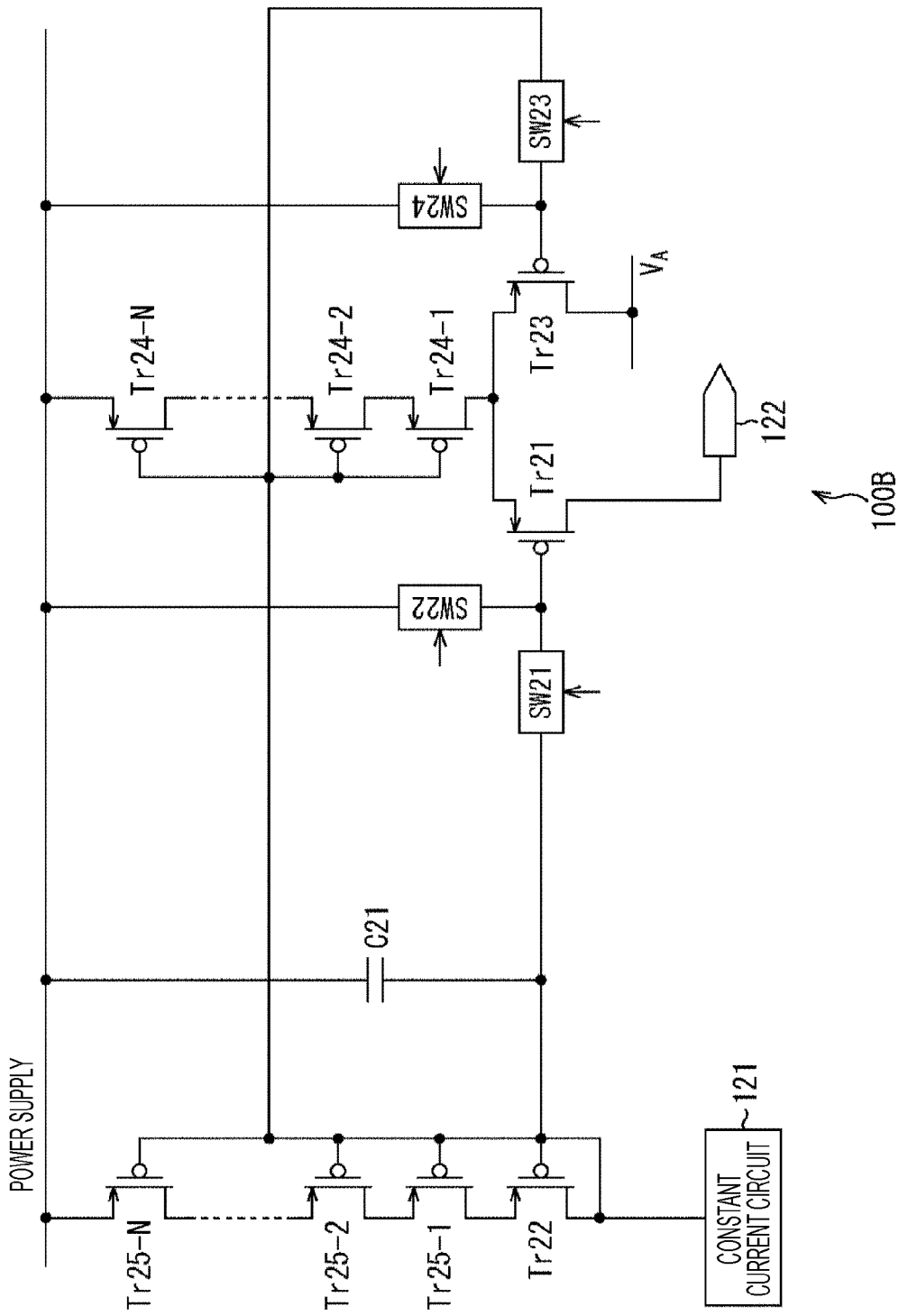
FIG. 3 is a circuit diagram illustrating an example of a second configuration of the charge pump circuit according to the first embodiment.

(Circuit diagram of second configuration) FIG. 3 is a circuit diagram illustrating an example of a second configuration of the charge pump circuit according to the first embodiment.

In FIG. 3, the source-type charge pump circuit 100B includes a constant current circuit 121, transistors Tr21, Tr22, Tr23, Tr24-1 to Tr24-N, and Tr25-1 to Tr25-N, switches SW21 to SW24, and capacitance C21. Note that, the transistors Tr21, Tr22, Tr23, Tr24-1 to Tr24-N, and Tr25-1 to Tr25-N can be configured as, for example, P-type MOS transistors.

The transistor Tr21 has the drain connected to the output terminal 122, the source connected to the source of the transistor Tr23, and the gate connected to the switches SW21 and SW22. Furthermore, the N (N: an integer greater than or equal to 1) vertically stacked transistors Tr24-1 to Tr24-N are connected to the source side of the transistor Tr21.

The transistor Tr22 has the drain connected to the constant current circuit 121. Furthermore, the gate of the transistor Tr22 is connected to the drain and the switch SW21. Moreover, N (N: an integer greater than or equal to 1) vertically stacked transistors Tr25-1 to Tr25-N are connected to the source side of the transistor Tr22, and all the gates of the transistors Tr25-1 to Tr25-N are connected to the gate of the transistor Tr22.

The transistor Tr23 has the drain connected to the voltage source (the arbitrary voltage $V_A$), the source connected to the source of the transistor Tr21, and the gate connected to the switches SW23 and SW24. Furthermore, the N vertically stacked transistors Tr24-1 to Tr24-N are connected to the source side of the transistor Tr23.

The N transistors Tr24-1 to Tr24-N are arranged in a cascade on the source side of the transistors Tr21 and Tr23, and all the gates of the transistors Tr24-1 to Tr24-N are connected to the gate of the transistor Tr22. Note that, the source of the N-th transistor Tr24-N among the vertically stacked transistors Tr24-1 to Tr24-N is connected to a power supply node.

The N transistors Tr25-1 to Tr25-N are arranged in a cascade on the source side of the transistor Tr22, and all the gates of the transistors Tr25-1 to Tr25-N are connected to the gate of the transistor Tr22. Note that, the source of the N-th transistor Tr25-N among the vertically stacked transistors Tr25-1 to Tr25-N is connected to the power supply node.

Here, the sizes of the transistors Tr in the source-type charge pump circuit 100B have a relationship as indicated in the following expressions (4) and (5).

$$Tr22=Tr21=Tr23 \quad (4)$$

$$Tr25=Tr24 \quad (5)$$

That is, the transistor Tr21, the transistor Tr22, and the transistor Tr23 have the same channel width (W length) and channel length (L length). Furthermore, the transistors Tr24-1 to Tr24-N and the transistors Tr25-1 to Tr25-N have the same channel width (W length) and channel length (L length).

The switch SW21 has one end connected to the gate of the transistor Tr21, and the other end connected to the gate of the transistor Tr22 and the gates of the transistors Tr25-1 to Tr25-N. The switch SW21 performs switching operation depending on a control signal input to the switch SW21.

The switch SW22 has one end connected to the gate of the transistor Tr21, and the other end connected to the power supply node. The switch SW22 performs switching operation depending on a control signal input to the switch SW22.

The switch SW23 has one end connected to the gate of the transistor Tr23, and the other end connected to the gate of the transistor Tr22, the gates of the transistors Tr25-1 to Tr25-N, and the gates of the transistors Tr24-1 to Tr24-N. The switch SW23 performs switching operation depending on a control signal input to the switch SW23.

The switch SW24 has one end connected to the gate of the transistor Tr23, and the other end connected to the power supply node. The switch SW24 performs switching operation depending on a control signal input to the switch SW24.

The capacitance C21 has one electrode connected to a signal line between the gate of the transistor Tr22 and the switch SW21, and the other electrode connected to the power supply node.

(Operation of Second Configuration)
Next, with reference to a timing chart of FIG. 4, operation will be described of the source-type charge pump circuit 100B illustrated in FIG. 3. In A to D of FIG. 4, levels are illustrated of the control signals input to the switches SW21 to SW24, respectively.

Figure 4:
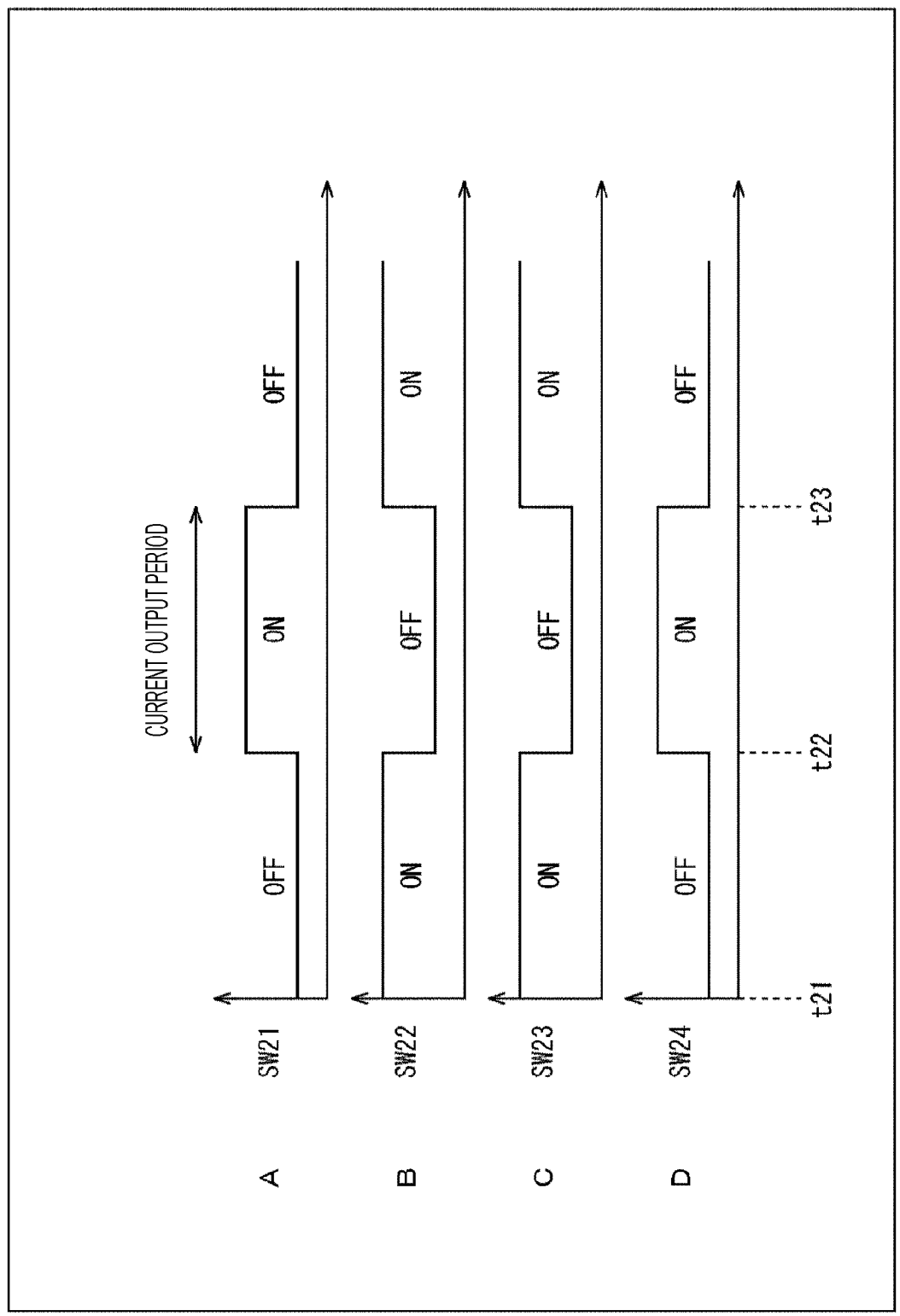
FIG. 4 is a timing chart illustrating operation of switches of the example of the second configuration of the charge pump circuit according to the first embodiment.

In FIG. 4, during the current output period, that is, from time t22 to time t23, the switches SW21 and SW24 are turned on, and the gate of the transistor Tr21 is electrically connected to the gate of the transistor Tr22 and the gates of the transistors Tr25-1 to Tr25-N, and the gate of the transistor Tr23 is connected to the power supply node.

By performing such switching control, in a state where the current source is turned on, the transistor Tr22 and the transistors Tr25-1 to Tr25-N, and the transistor Tr21 and the transistors Tr24-1 to Tr24-N have the same configuration, so that it is possible to perform current mirror operation and output an intended current.

Note that, the principle that a capacitance value (a capacitance value of the capacitance C21) for suppressing a decrease in an injection (source) current value due to charge sharing can be reduced to 1/(N+1) is basically similar to that described above, so that the description thereof is omitted here. However, also in this case, the circuit area can be reduced by setting the capacitance value to 1/(N+1).

On the other hand, in FIG. 4, during a period excluding the current output period, that is, during a period from time t21 to time t22 and a period on and after time t23, the switches SW22 and SW23 are turned on, and the gate of the transistor Tr21 is connected to the power supply node, and the gate of the transistor Tr23 is electrically connected to the gate of the transistor Tr22, the gates of the transistors Tr25-1 to Tr25-N, and the gates of the transistors Tr24-1 to Tr24-N.

By performing such switching control, in a state where the current source is turned off, the transistor Tr23 and the transistors Tr24-1 to Tr24-N have a current mirror configuration with the transistor Tr22 and the transistors Tr25-1 to Tr25-N, so that current steering operation for supplying an arbitrary current is performed on an arbitrary voltage side. As a result, it is possible to perform high-speed current on/off operation as described above, for example.

Note that, in the timing chart of FIG. 4, similarly to the timing chart of FIG. 2 described above, the on/off timings of the switches SW21 and SW22 (or the switches SW23 and SW24) are slightly shifted, whereby an outflow can be suppressed of electric charges due to simultaneous turning on of the switches SW21 and SW22 (or the switches SW23 and SW24).

In the above, the configuration and operation have been described of the source-type charge pump circuit 100B.

(Circuit Diagram of Third Configuration)

Figure 5:
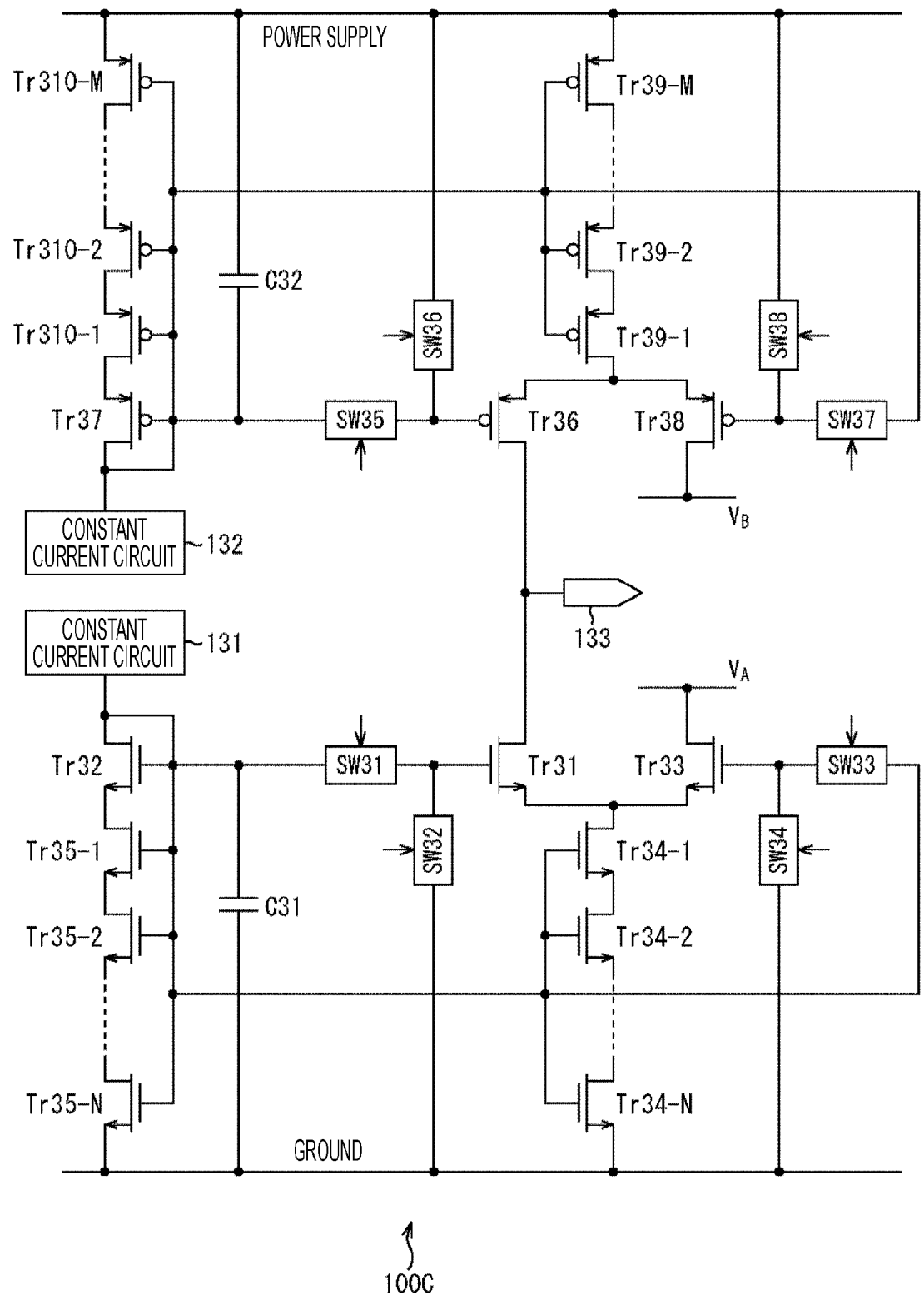
FIG. 5 is a circuit diagram illustrating an example of a third configuration of the charge pump circuit according to the first embodiment.

FIG. 5 is a circuit diagram illustrating an example of a third configuration of the charge pump circuit according to the first embodiment.

As illustrated in FIG. 5, the sink/source integrated-type charge pump circuit 100C is a charge pump circuit in which the sink-type charge pump circuit 100A (FIG. 1) and the source-type charge pump circuit 100B (FIG. 3) are integrated together.

In FIG. 5, the sink/source integrated-type charge pump circuit 100C includes a constant current circuit 131, transistors Tr31, Tr32, Tr33, Tr34-1 to Tr34-N, and Tr35-1 to Tr35-N, switches SW31 to SW34, and capacitance C31, and a constant current circuit 132, transistors Tr36, Tr37, Tr38, Tr39-1 to Tr39-M, and Tr310-1 to Tr310-M, switches SW35 to SW38, and capacitance C32.

In the sink/source integrated-type charge pump circuit 100C, the constant current circuit 131, the transistors Tr31, Tr32, Tr33, Tr34-1 to Tr34-N, and Tr35-1 to Tr35-N, the switches SW31 to SW34, and the capacitance C31 correspond to the constant current circuit 111, the transistors Tr11, Tr12, Tr13, Tr14-1 to Tr14-N, and Tr15-1 to Tr15-N, the switches SW11 to SW14, and the capacitance C11 of the sink-type charge pump circuit 100A (FIG. 1).

Furthermore, in the sink/source integrated-type charge pump circuit 100C, the constant current circuit 132, the transistors Tr36, Tr37, Tr38, Tr39-1 to Tr39-M, and Tr310-1 to Tr310-M, the switches SW35 to SW38, and the capacitance C32 correspond to the constant current circuit 121, the transistors Tr21, Tr22, Tr23, Tr24-1 to Tr24-N, and Tr25-1 to Tr25-N, the switches SW21 to SW24, and the capacitance C21 of the source-type charge pump circuit 100B (FIG. 3).

Moreover, in the sink/source integrated-type charge pump circuit 100C, an output terminal 133 corresponds to the output terminal 112 of the sink-type charge pump circuit 100A (FIG. 1) or the output terminal 122 of the source-type charge pump circuit 100B (FIG. 3).

That is, the sink/source integrated-type charge pump circuit 100C includes the transistors Tr31, Tr32, Tr33, Tr34-1 to Tr34-N, and Tr35-1 to Tr35-N, the switches SW31 to SW34, and the capacitance C31 as elements on the sink-type side, and includes the transistors Tr36, Tr37, Tr38, Tr39-1 to Tr39-M, and Tr310-1 to Tr310-M, the switches SW35 to SW38, and the capacitance C32 as elements on the source-type side.

Note that, the sizes of the transistors Tr on the sink-type side and the source-type side in the sink/source integrated-type charge pump circuit 100C have a relationship as indicated in the following expressions (6) to (9).

$$Tr32=Tr31=Tr33 \quad (6)$$

$$Tr35=Tr34 \quad (7)$$

$$Tr37=Tr36=Tr38 \quad (8)$$

$$Tr310=Tr39 \quad (9)$$

That is, the transistor Tr31, the transistor Tr32, and the transistor Tr33 have the same channel width (W length) and channel length (L length). Furthermore, the transistors Tr34-1 to Tr34-N and the transistors Tr35-1 to Tr35-N have the same channel width (W length) and channel length (L length).

Moreover, the transistor Tr36, the transistor Tr37, and the transistor Tr38 have the same channel width (W length) and channel length (L length). Furthermore, the transistors Tr39-1 to Tr39-N and the transistors Tr310-1 to Tr310-N have the same channel width (W length) and channel length (L length).

(Operation of Third Configuration)

Next, with reference to a timing chart of FIG. 6, operation will be described of the sink/source integrated-type charge pump circuit 100C illustrated in FIG. 5. In A to D of FIG. 6, levels are illustrated of the control signals input to the switches SW31 to SW34 on the sink-type side, and in E to H of FIG. 6, levels are illustrated of the control signals input to the switches SW35 to SW38 on the source-type side.

Figure 6:
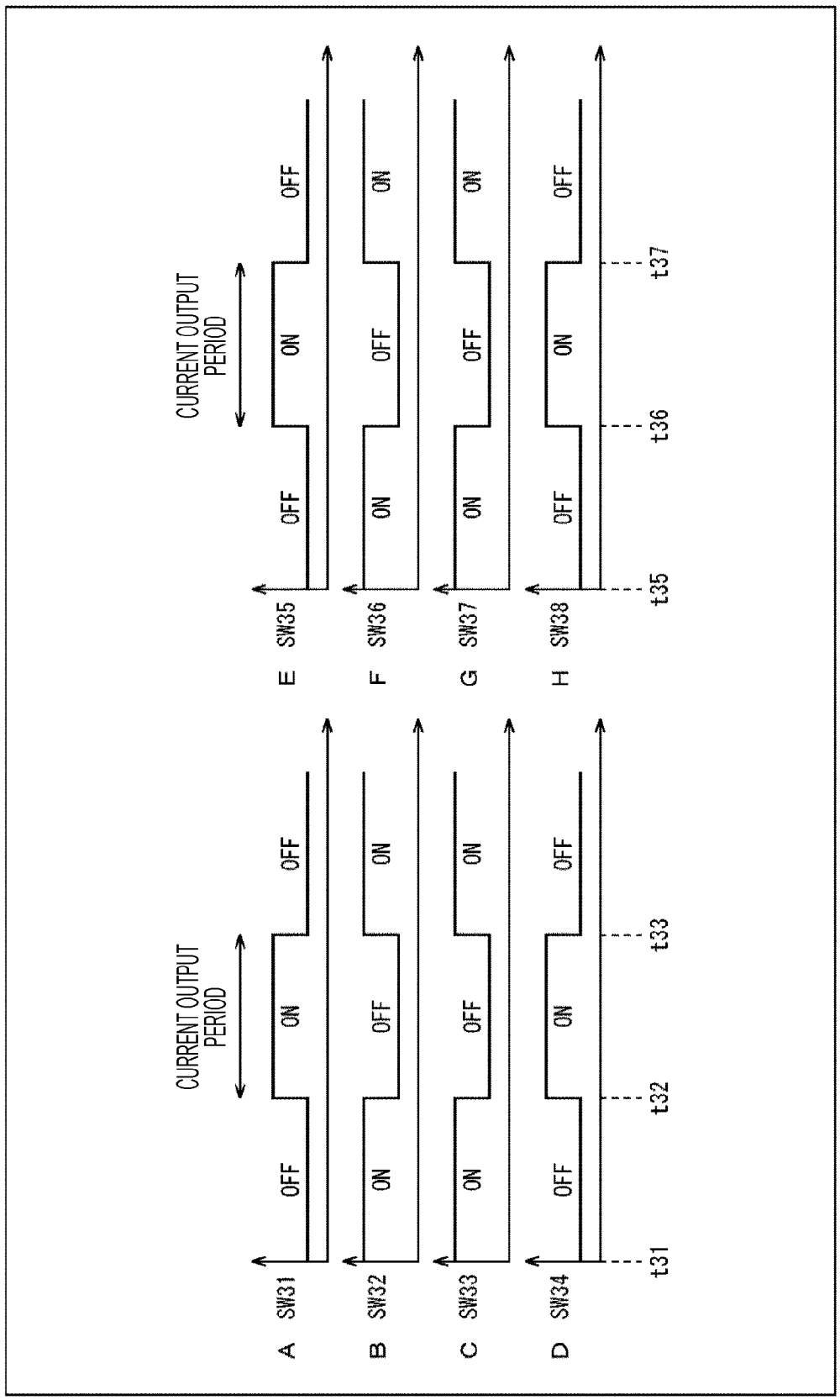
FIG. 6 is a timing chart illustrating operation of switches of the example of the third configuration of the charge pump circuit according to the first embodiment.

In A to D of FIG. 6, during the current output period on the sink-type side, that is, from time t32 to time t33, the switches SW31 and SW34 are turned on, and the gate of the transistor Tr31 is electrically connected to the gate of the transistor Tr32 and the gates of the transistor Tr35-1 to Tr35-N, and the gate of the transistor Tr33 is connected to the ground node.

On the other hand, in A to D of FIG. 6, during a period excluding the current output period on the sink-type side, that is, during a period from time t31 to time t32 and a period on and after time t33, the switches SW32 and SW33 are turned on, and the gate of the transistor Tr31 is connected to the ground node, and the gate of the transistor Tr33 is electrically connected to the gate of the transistor Tr32, the gates of the transistors Tr35-1 to Tr35-N, and the gates of the transistors Tr34-1 to Tr34-N.

Furthermore, in E to H of FIG. 6, during the current output period on the source-type side, that is, from time t36 to time t37, the switches SW35 and SW38 are turned on, and the gate of the transistor Tr36 is electrically connected to the gate of the transistor Tr37, and the gates of the transistors Tr310-1 to Tr310-N, and the gate of the transistor Tr38 is connected to the power supply node.

On the other hand, in E to H in FIG. 6, during a period excluding the current output period on the source-type side, that is, during a period from time t35 to time t36 and a period on and after time t37, the switches SW36 and SW37 are turned on, and the gate of the transistor Tr36 is connected to the power supply node, and the gate of the transistor Tr38 is electrically connected to the gate of the transistor Tr37, the gates of the transistors Tr310-1 to Tr310-N, and the gates of the transistors Tr39-1 to Tr39-N.

Note that, details of the operation and the principle of suppressing a decrease in a sink or source (injection) current value due to charge sharing by arranging capacitance values (capacitance values of the capacitances C31 and C32) to be 1/(N+1) are basically similar to those described above, so that the descriptions thereof are omitted here.

In the above, the configuration and operation have been described of the sink/source integrated-type charge pump circuit 100C.

2. Second Embodiment

In a second embodiment, a configuration will be described in which a charge canceling mechanism is provided in a case where a gate switching type configuration is adopted as a charge pump circuit 200. In the following description, configurations and operations will be described in order of a sink-type charge pump circuit 200A, a source-type charge pump circuit 200B, and a sink/source integrated-type charge pump circuit 200C.

(Circuit Diagram of First Configuration)

Figure 7:
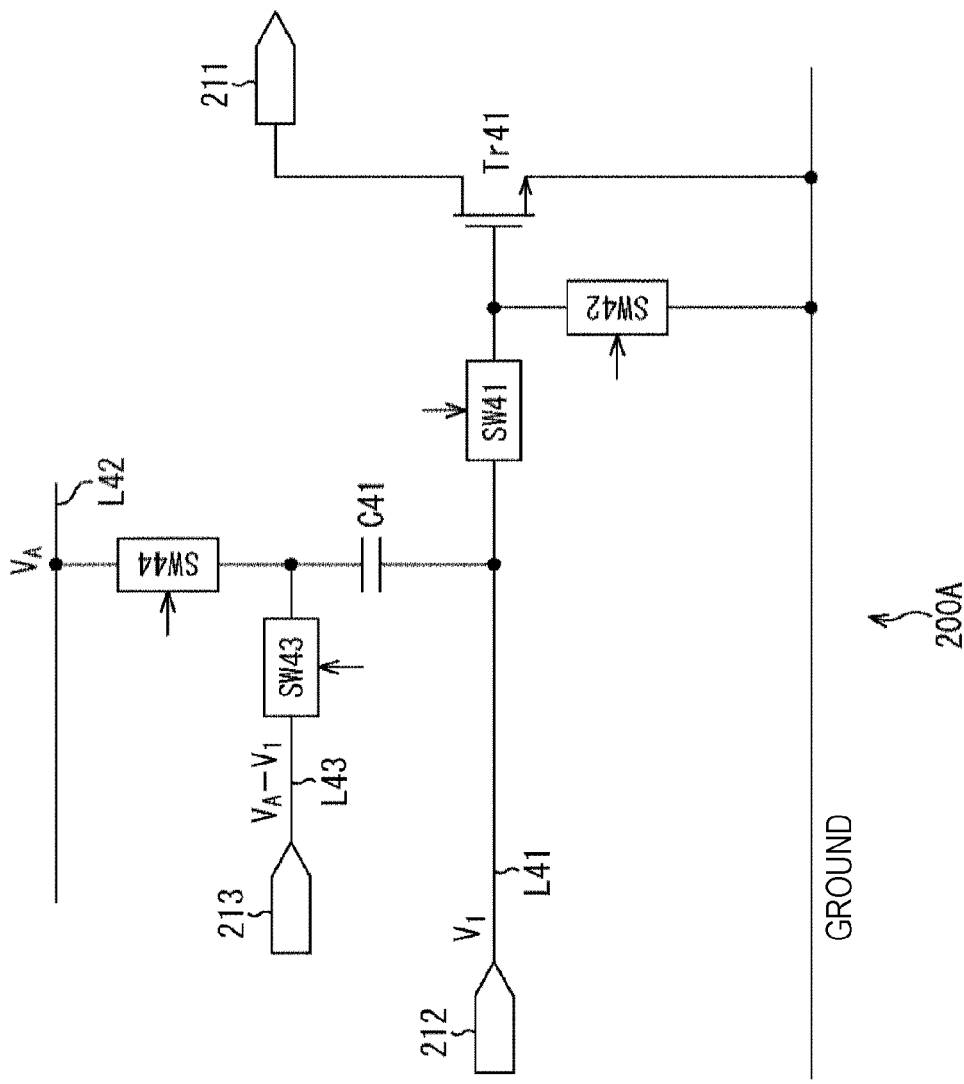
FIG. 7 is a circuit diagram illustrating an example of a first configuration of a charge pump circuit according to a second embodiment.

FIG. 7 is a circuit diagram illustrating an example of a first configuration of the charge pump circuit according to the second embodiment.

In FIG. 7, the sink-type charge pump circuit 200A includes a current source transistor Tr41, switches SW41 to SW44, and capacitance C41.

The current source transistor Tr41 is configured as, for example, an N-type MOS transistor. In the current source transistor Tr41, the drain is connected to an output terminal 211, the source is connected to the ground node, and the gate is connected to the switches SW41 and SW42.

The switch SW41 has one end connected to the gate of the current source transistor Tr41, and the other end connected to a signal line L41 to which a voltage $V_1$ from an input terminal 212 is applied. The switch SW41 performs switching operation depending on a control signal input to the switch SW41. When turned on, the switch SW41 electrically connects the gate of the current source transistor Tr41 to the signal line L41.

The switch SW42 has one end connected to the gate of the current source transistor Tr41, and the other end connected to the ground node. The switch SW42 performs switching operation depending on a control signal input to the switch SW42. When turned on, the switch SW42 connects the gate of the current source transistor Tr41 to the ground node.

Here, in the sink-type charge pump circuit 200A, the charge canceling mechanism is provided for such a gate switching type configuration, whereby capacitance (sufficiently large capacitance) for suppressing a decrease in a current value is unnecessary (or the capacitance is reduced). That is, in the charge canceling mechanism, the capacitance C41 is provided for the signal line L41 (current mirror source side) between the switch SW41 and the input terminal 212, and it is enabled to arbitrarily switch a potential of a connection destination of the capacitance C41 by the switches SW43 and SW44.

More specifically, the charge canceling mechanism is configured as follows. That is, the capacitance C41 has one electrode connected to the signal line L41, and the other electrode connected to the switches SW43 and SW44.

The switch SW43 has one end connected between the capacitance C41 (the other electrode thereof) and the switch SW44, and the other end connected to a signal line L43 to which a voltage $V_A-V_1$ from an input terminal 213 is applied. The switch SW43 performs switching operation depending on a control signal input to the switch SW43. When turned on, the switch SW43 electrically connects the capacitance C41 (the other electrode thereof) to the signal line L43.

The switch SW44 has one end connected to the capacitance C41 (the other electrode thereof), and the other end connected to a signal line L42 to which the arbitrary voltage $V_A$ by the voltage source is applied. The switch SW44 performs switching operation depending on a control signal input to the switch SW44. When turned on, the switch SW44 electrically connects the capacitance C41 (the other electrode thereof) to the signal line L42.

Here, in the charge canceling mechanism, when a voltage applied to the signal line L41 connected to the input terminal 212 is set to the voltage $V_1$, and a voltage applied to the signal line L42 connected to the voltage source is set to the voltage $V_A$, a voltage applied to the signal line L43 connected to the input terminal 213 is set to the voltage $V_A-V_1$ that is a difference voltage between the voltage $V_A$ and the voltage $V_1$. That is, as arbitrarily switchable voltages of the connection destination of the capacitance C41 (the other electrode thereof), one voltage is set to the voltage $V_A$, and the other voltage is set to the voltage $V_A-V_1$.

At this time, by setting a value of the capacitance C41 to the same value as a parasitic capacitance component depending on the gate node of the current source transistor Tr41, as for the amount of charge sharing to the parasitic capacitance on the gate side, generated charge injection into the current mirror becomes equal by a potential change ($\Delta V=V_1$) of the connection destination of the capacitance C41, and a decrease in the sink current value due to the charge sharing can be suppressed in principle.

This means that, in the configuration of the conventional gate switching type charge pump circuit, it has been necessary to arrange a sufficiently large capacitance value compared to the parasitic capacitance on the current source gate side, but it is only required to arrange capacitance equivalent to the parasitic capacitance; as a result, the circuit area can be reduced.

(Operation of First Configuration)

Next, with reference to a timing chart of FIG. 8, operation will be described of the sink-type charge pump circuit 200A illustrated in FIG. 7. In A to D of FIG. 8, levels are illustrated of the control signals input to the switches SW41 to SW44, respectively, and each switch SW performs switching operation depending on the control signal of the H level or the L level.

Figure 8:
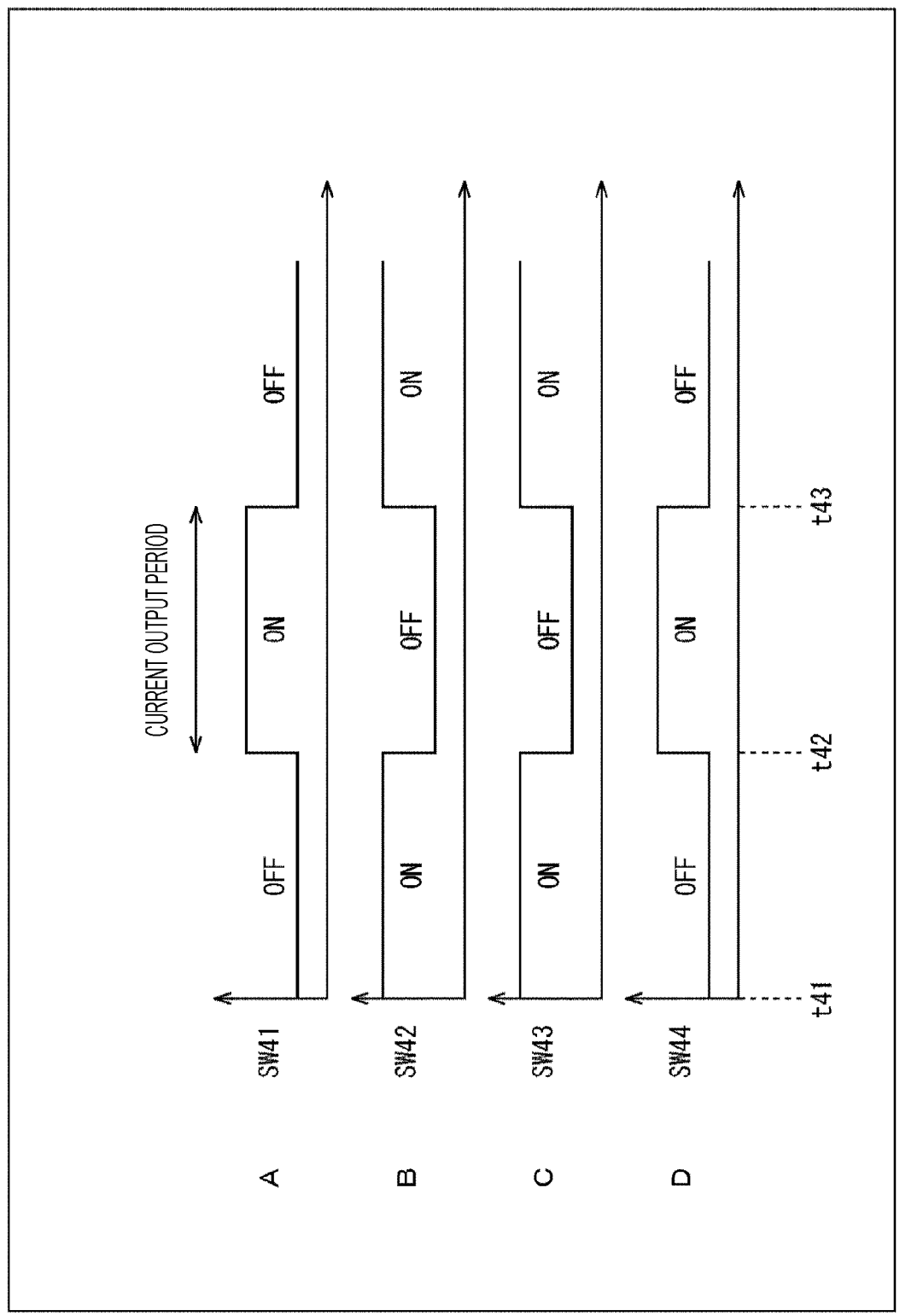
FIG. 8 is a timing chart illustrating operation of switches in the example of the first configuration of the charge pump circuit according to the second embodiment.

In FIG. 8, a period from time t42 to time t43 is the current output period in which a current is output from the output terminal 211. During the current output period, the switches SW41 and SW44 are turned on, and the gate of the current source transistor Tr41 is electrically connected to the signal line L41 to which the voltage $V_1$ is applied, and the capacitance C41 (the other electrode thereof) connected to the signal line L41 is electrically connected to the signal line L42 to which the voltage $V_A$ is applied.

On the other hand, in FIG. 8, during a period excluding the current output period, that is, during a period from time t41 to time t42 and a period on and after time t43, the switches SW42 and SW43 are turned on, and the gate of the current source transistor Tr41 is connected to the ground node, and the capacitance C41 (the other electrode thereof) is electrically connected to the signal line L43 to which the voltage $V_A - V_1$ is applied.

Here, by performing exclusive control on the switches SW41 and SW42 and performing exclusive control on the switches SW43 and SW44, when the current output period is reached, the connection destination of the capacitance C41 is changed from the signal line L43 to which the voltage $V_A - V_1$ is applied to the signal line L42 to which the voltage $V_A$ is applied, and a potential change ($\Delta V = V_1$) occurs, and shared charges can be charged from the charge canceling mechanism (the capacitance C41 thereof) side, so that it is possible to suppress a decrease in the sink current value due to the charge sharing.

Note that, in the timing chart of FIG. 8, the timings of turning on/off the switches SW41 to SW44 have been described as being all switched simultaneously at time t42, time t43, and the like for convenience of description; however, the on/off timings of the switches SW41 and SW42 or the on/off timings of the switches SW43 and SW44 are slightly shifted actually, whereby an outflow is suppressed of electric charges due to simultaneous turning on of the switches SW41 and SW42 or simultaneous turning on of the switches SW43 and SW44.

As described above, in the sink-type charge pump circuit 200A, the charge canceling mechanism is provided, whereby it is possible in principle to suppress the decrease in the sink current value caused by the charge sharing to the parasitic capacitance at the gate node of the current source. At that time, it is only required to arrange the capacitance equivalent to the parasitic capacitance as the capacitance C41, so that the circuit area can be reduced as a result.

For example, as disclosed in Patent Document 1 described above, when a current source is turned on at the time of source (injection) or sink, charge sharing occurs to a capacitance component existing at the gate of the current source transistor, so that the output current is less than the current value obtained by the original current mirror. To suppress this, it is necessary to arrange a sufficiently large capacitance before the switch, and the circuit area increases as described above. Note that, the current source transistor often uses the channel length (L length) thickly in general and the capacitance seen from the gate side has a large capacitance value, and here, it is necessary to arrange capacitance larger than the capacitance value.

On the other hand, in the sink-type charge pump circuit 200A, when the charge canceling mechanism is provided for the gate switching type configuration, it is only required to arrange the capacitance C41 equivalent to the parasitic capacitance of the gate node of the current source transistor Tr41, so that the circuit area can be reduced. As a result, in the gate switching type charge pump circuit 200A, it is possible to reduce the circuit area while enabling reduction of a leak current and low voltage operation.

(Circuit Diagram of Second Configuration)

Figure 9:
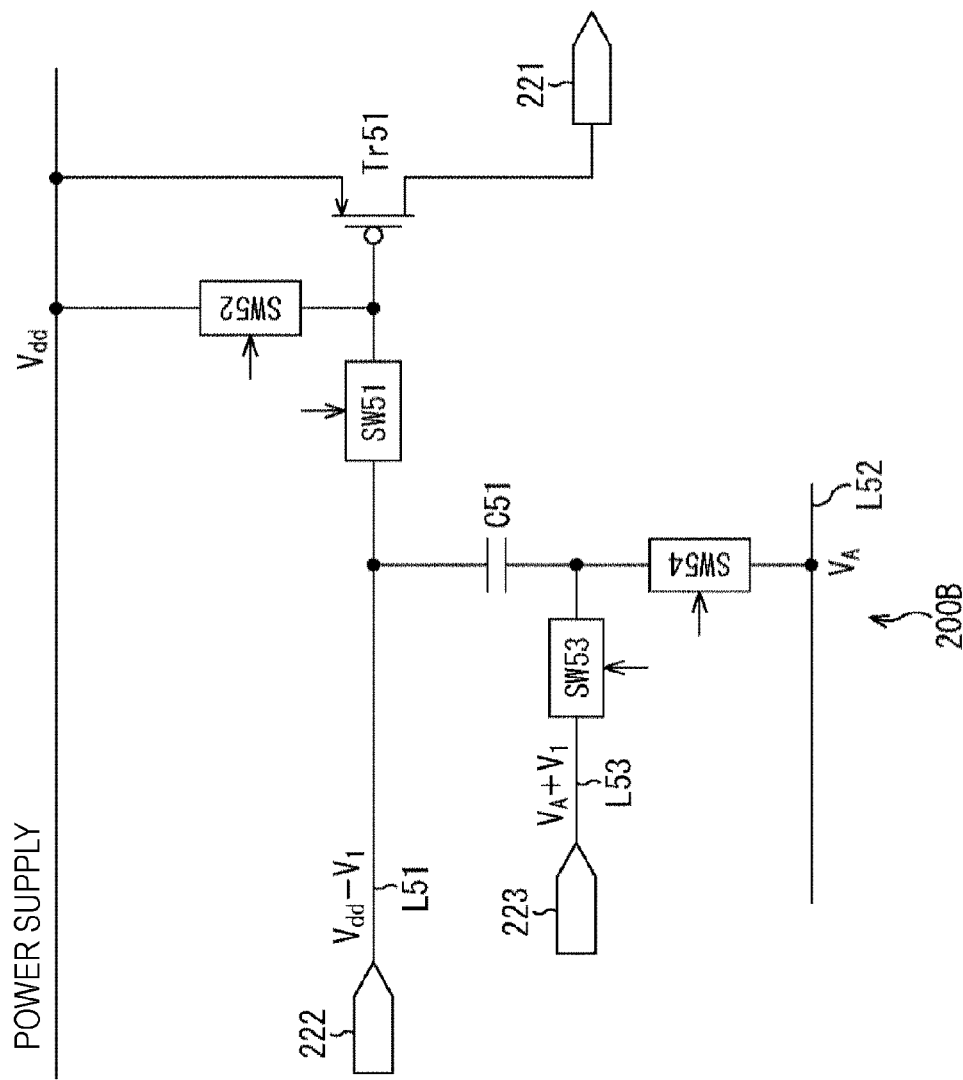
FIG. 9 is a circuit diagram illustrating an example of a second configuration of the charge pump circuit according to the second embodiment.

FIG. 9 is a circuit diagram illustrating an example of a second configuration of the charge pump circuit according to the second embodiment.

In FIG. 9, the source-type charge pump circuit 200B includes a current source transistor Tr51, switches SW51 to SW54, and capacitance C51.

The current source transistor Tr51 is configured as, for example, a P-type MOS transistor. In the current source transistor Tr51, the drain is connected to an output terminal 221, the source is connected to the power supply node, and the gate is connected to the switches SW51 and SW52.

The switch SW51 has one end connected to the gate of the current source transistor Tr51, and the other end connected to a signal line L51 to which a voltage $V_{dd} - V_1$ from an input terminal 222 is applied. The switch SW51 performs switching operation depending on a control signal input to the switch SW51. When turned on, the switch SW51 electrically connects the gate of the current source transistor Tr51 to the signal line L51.

The switch SW52 has one end connected to the gate of the current source transistor Tr51, and the other end connected to the power supply node. The switch SW52 performs switching operation depending on a control signal input to the switch SW52, and when turned on, connects the gate of the current source transistor Tr51 to the power supply node.

Here, in the source-type charge pump circuit 200B, the capacitance C51 is provided as the charge canceling mechanism for such a gate switching type configuration, and it is enabled to arbitrarily switch a potential of the connection destination of the capacitance C51 by the switches SW53 and SW54.

More specifically, the charge canceling mechanism is configured as follows. That is, the capacitance C51 has one electrode connected to the signal line L51, and the other electrode connected to the switches SW53 and SW54.

The switch SW53 has one end connected between the capacitance C51 (the other electrode thereof) and the switch SW54, and the other end connected to a signal line L53 to which a voltage $V_A + V_1$ from an input terminal 223 is applied. The switch SW53 performs switching operation depending on a control signal input to the switch 53, and when turned on, connects the capacitance C51 (the other electrode thereof) to the signal line L53.

The switch SW54 has one end connected to the capacitance C51 (the other electrode thereof), and the other end connected to a signal line L52 to which the arbitrary voltage $V_A$ by the voltage source is applied. The switch SW54 performs switching operation depending on a control signal input to the switch SW54, and when turned on, connects the capacitance C51 (the other electrode thereof) to the signal line L52.

Here, in the charge canceling mechanism, when a voltage applied to the signal line L51 connected to the input terminal 222 is set to the voltage $V_{dd} - V_1$, and a voltage applied to the signal line L52 connected to the voltage source is set to the voltage $V_A$, a voltage applied to the signal line L53 connected to the input terminal 223 is set to the voltage $V_A + V_1$ that is a sum of the voltage $V_A$ and the voltage $V_1$. That is, as arbitrarily switchable voltages of the connection destination of the capacitance C51 (the other electrode thereof), one voltage is set to the voltage $V_A$, and the other voltage is set to the voltage $V_A + V_1$.

Note that, the principle of suppressing a decrease in the source (injection) current value due to charge sharing by arranging capacitance equivalent to the parasitic capacitance of the gate node of the current source transistor Tr51 as the capacitance C51 is basically similar to that described above, so that the description thereof is omitted here. However, also in this case, the circuit area can be reduced by arranging the capacitance C51 equivalent to the parasitic capacitance as the charge canceling mechanism.

(Operation of Second Configuration)

Next, with reference to a timing chart of FIG. 10, operation will be described of the source-type charge pump circuit 200B illustrated in FIG. 9. In A to D of FIG. 10, levels (H level, L level) are illustrated of the control signals input to the switches SW51 to SW54, respectively.

Figure 10:
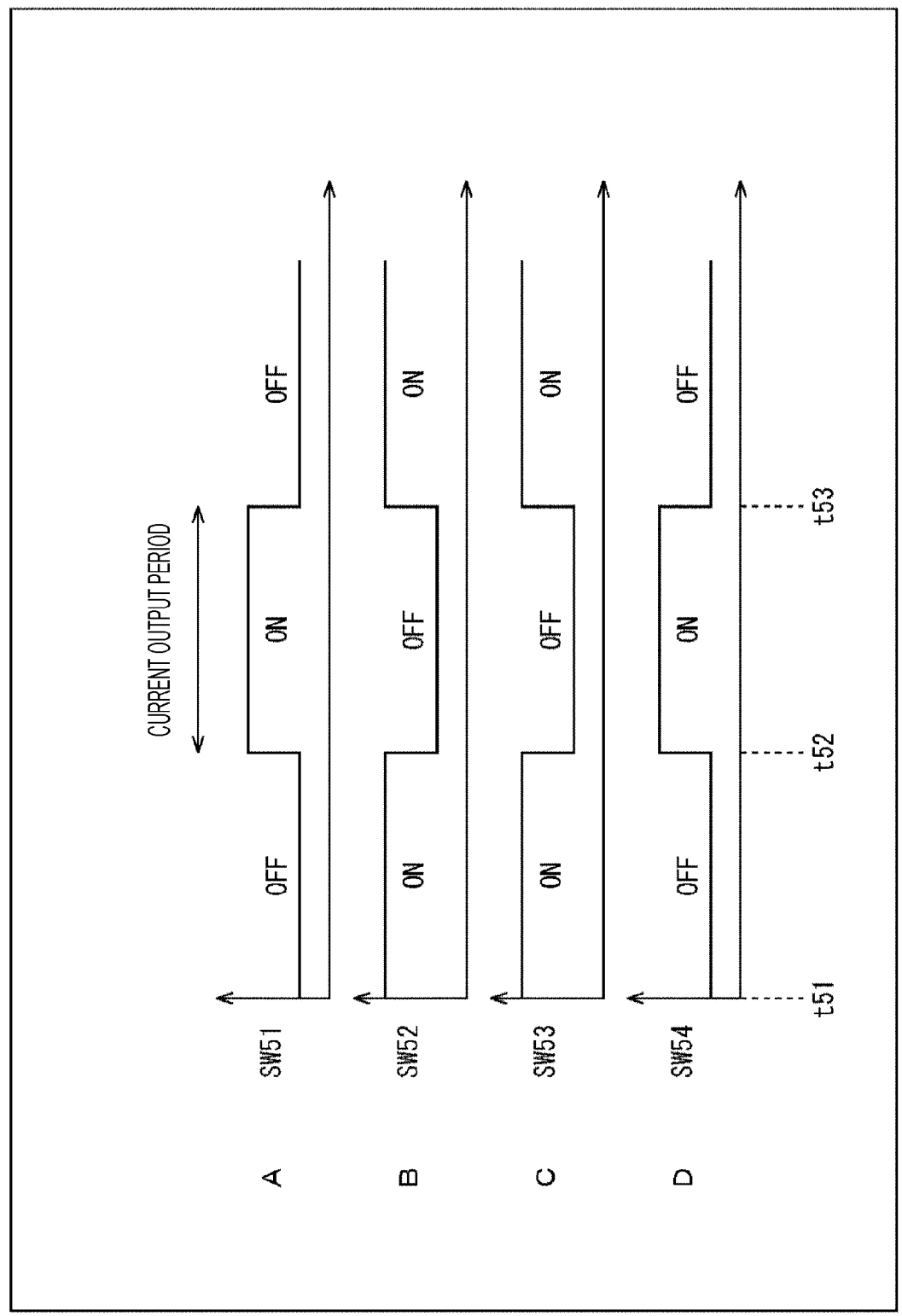
FIG. 10 is a timing chart illustrating operation of switches of the example of the second configuration of the charge pump circuit according to the second embodiment.

In FIG. 10, during the current output period, that is, from time t52 to time t53, the switches SW51 and SW54 are turned on, and the gate of the current source transistor Tr51 is electrically connected to the signal line L51 to which the voltage $V_{dd}-V_1$ is applied, and the capacitance C51 (the other electrode thereof) connected to the signal line L51 is electrically connected to the signal line L52 to which the voltage $V_A$ is applied.

On the other hand, in FIG. 10, during a period excluding the current output period, that is, during a period from time t51 to time t52 and a period on and after time t53, the switches SW52 and SW53 are turned on, and the gate of the current source transistor Tr51 is connected to the power supply node, and the capacitance C51 (the other electrode thereof) is electrically connected to the signal line L53 to which the voltage $V_A+V_1$ is applied.

Here, by performing exclusive control on the switches SW51 and SW52 and performing exclusive control on the switches SW53 and SW54, when the current output period is reached, the connection destination of the capacitance C51 is changed from the signal line L53 to which the voltage $V_A+V_1$ is applied to the signal line L52 to which the voltage $V_A$ is applied, and a potential change ($\Delta V=V_1$) occurs, and shared charges can be charged from the charge canceling mechanism (the capacitance C51 thereof) side, so that it is possible to suppress a decrease in the source (injection) current value due to the charge sharing.

Note that, in the timing chart of FIG. 10, similarly to the timing chart of FIG. 8 described above, the on/off timings of the switches SW51 and SW52 (or the switches SW53 and SW54) are slightly shifted, whereby an outflow can be suppressed of electric charges due to simultaneous turning on of the switches SW51 and SW52 (or the switches SW53 and SW54).

In the above, the configuration and operation have been described of the source-type charge pump circuit 200B.

(Circuit Diagram of Third Configuration)

Figure 11:
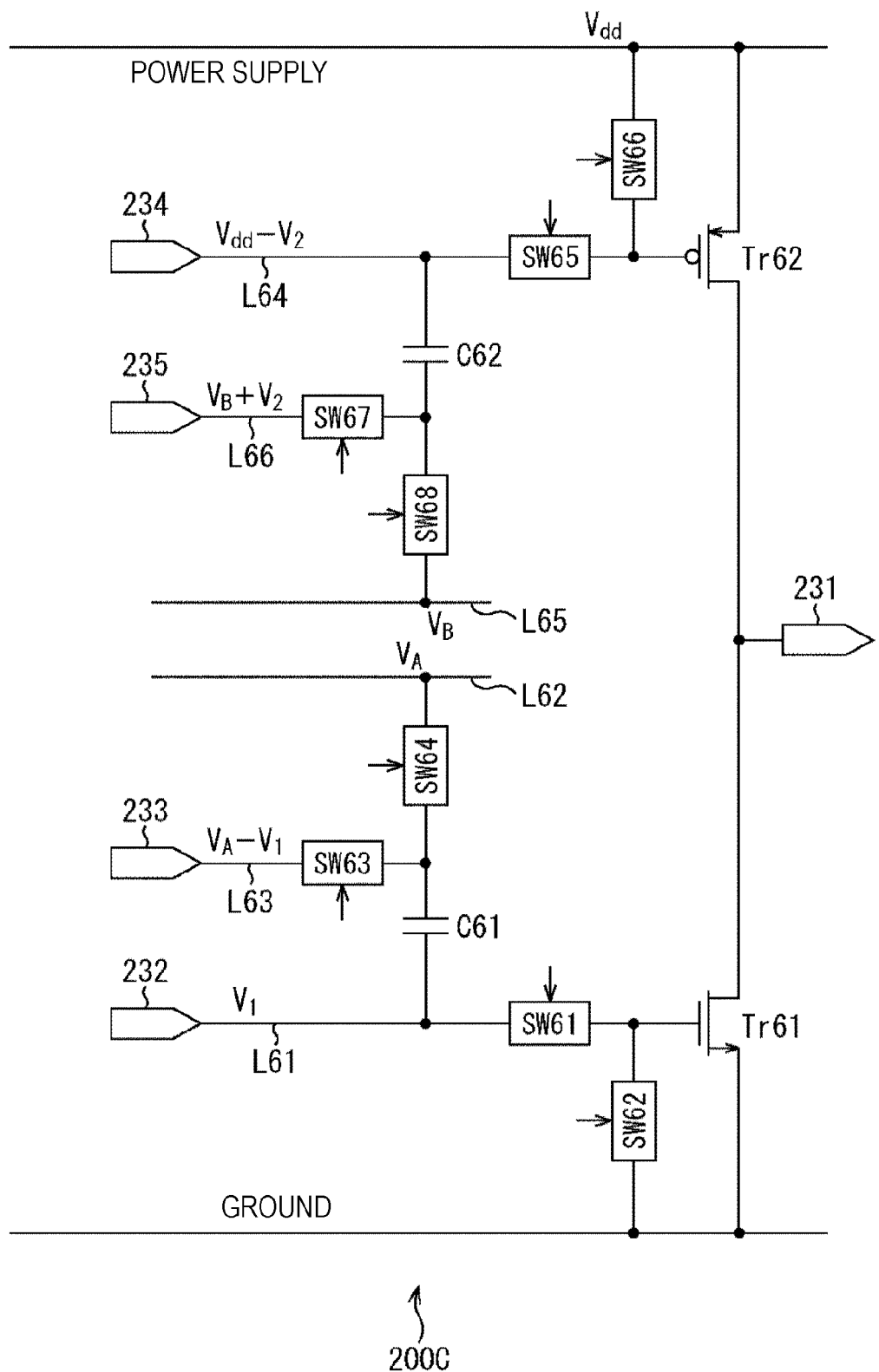
FIG. 11 is a circuit diagram illustrating an example of a third configuration of the charge pump circuit according to the second embodiment.

FIG. 11 is a circuit diagram illustrating an example of a third configuration of the charge pump circuit according to the second embodiment.

As illustrated in FIG. 11, the sink/source integrated-type charge pump circuit 200C is a charge pump circuit in which the sink-type charge pump circuit 200A (FIG. 7) and the source-type charge pump circuit 200B (FIG. 9) are integrated together.

In FIG. 11, the sink/source integrated-type charge pump circuit 200C includes a current source transistor Tr61, switches SW61 to SW64, and capacitance C61, and a current source transistor Tr62, switches SW65 to SW68, and capacitance C62.

In the sink/source integrated-type charge pump circuit 200C, the current source transistor Tr61, the switches SW61 to SW64, and the capacitance C61 correspond to the current source transistor Tr41, the switches SW41 to SW44, and the capacitance C41 of the sink-type charge pump circuit 200A (FIG. 7).

Furthermore, in the sink/source integrated-type charge pump circuit 200C, the current source transistor Tr62, the switches SW65 to SW68, and the capacitance C62 correspond to the current source transistor Tr51, the switches SW51 to SW54, and the capacitance C51 of the source-type charge pump circuit 200B (FIG. 9).

Moreover, in the sink/source integrated-type charge pump circuit 200C, an output terminal 231 corresponds to the output terminal 211 (FIG. 7) or the output terminal 221 (FIG. 9), input terminals 232 and 233 correspond to the input terminals 212 and 213 (FIG. 7), and input terminals 234 and 235 correspond to the input terminals 222 and 223 (FIG. 9).

That is, in the sink/source integrated-type charge pump circuit 200C, the charge canceling mechanism is provided for each of the gate switching type configurations on the sink-type side and the source-type side.

In the charge canceling mechanism on the sink-type side, as arbitrarily switchable voltages of the connection destination of the capacitance C61 (the other electrode thereof), one voltage is set to the voltage $V_A$, and the other voltage is set to the voltage $V_A-V_1$. Furthermore, in the charge canceling mechanism on the source-type side, as arbitrarily switchable voltages of the connection destination of the capacitance C62 (the other electrode thereof), one voltage is set to a voltage $V_B$, and the other voltage is set to a voltage $V_B+V_2$.

(Operation of Third Configuration)

Next, with reference to a timing chart of FIG. 12, operation will be described of the sink/source integrated-type charge pump circuit 200C illustrated in FIG. 11. In A to D of FIG. 12, levels are illustrated of the control signals input to the switches SW61 to SW64 on the sink-type side, and in E to H of FIG. 12, levels are illustrated of the control signals input to the switches SW65 to SW68 on the source-type side.

Figure 12:
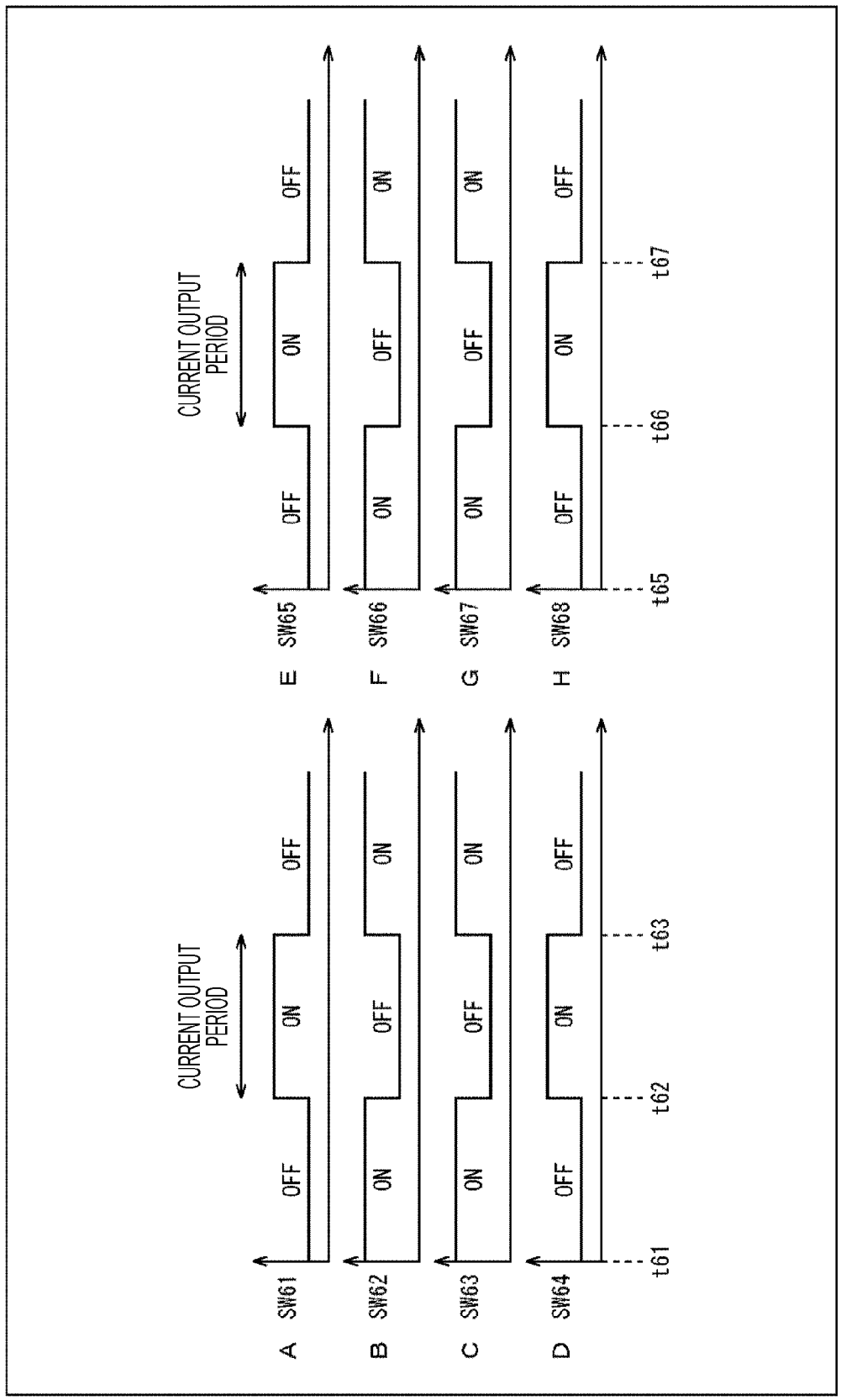
FIG. 12 is a timing chart illustrating operation of switches of the example of the third configuration of the charge pump circuit according to the second embodiment.

In A to D of FIG. 12, during the current output period on the sink-type side, that is, from time t62 to time t63, the switches SW61 and SW64 are turned on, and the gate of the current source transistor Tr61 is electrically connected to the signal line L61 to which the voltage $V_1$ is applied, and the capacitance C61 (the other electrode thereof) is electrically connected to the signal line L62 to which the voltage $V_A$ is applied.

On the other hand, in A to D of FIG. 12, during a period excluding the current output period on the sink-type side, that is, during a period from time t61 to time t62 and a period on and after time t63, the switches SW62 and SW63 are turned on, and the gate of the current source transistor Tr61 is connected to the ground node, and the capacitance C61 (the other electrode thereof) is electrically connected to the signal line L63 to which the voltage $V_A-V_1$ is applied.

Furthermore, in E to H of FIG. 12, during the current output period on the source-type side, that is, from time t66 to time t67, the switches SW65 and SW68 are turned on, and the gate of the current source transistor Tr62 is electrically connected to the signal line L64 to which a voltage $V_{dd}-V_2$ is applied, and the capacitance C62 (the other electrode thereof) is electrically connected to the signal line L65 to which the voltage $V_B$ is applied.

On the other hand, in E to H of FIG. 12, during a period excluding the current output period on the source-type side, that is, during a period from time t65 to time t66 and a period on and after time t67, the switches SW66 and SW67 are turned on, and the gate of the current source transistor Tr62 is electrically connected to the power supply node, and the capacitance C62 (the other electrode thereof) is electrically connected to the signal line L66 to which the voltage $V_B+V_2$ is applied.

Note that, details of the operation and the principle of suppressing a decrease in a sink or source (injection) current value due to charge sharing by arranging the capacitances C61 and C62 are basically similar to those described above, so that the descriptions thereof are omitted here.

In the above, the configuration and operation have been described of the sink/source integrated-type charge pump circuit 200C.

3. Third Embodiment

In a third embodiment, a gate switching type configuration is adopted as a charge pump circuit 300, and a configuration will be described including a specific potential generation means in a case where the charge canceling mechanism is provided similarly to the second embodiment described above. In the following description, configurations and operations will be described in order of a sink-type charge pump circuit 300A, a source-type charge pump circuit 300B, and a sink/source integrated-type charge pump circuit 300C.

(Circuit Diagram of First Configuration)

Figure 13:
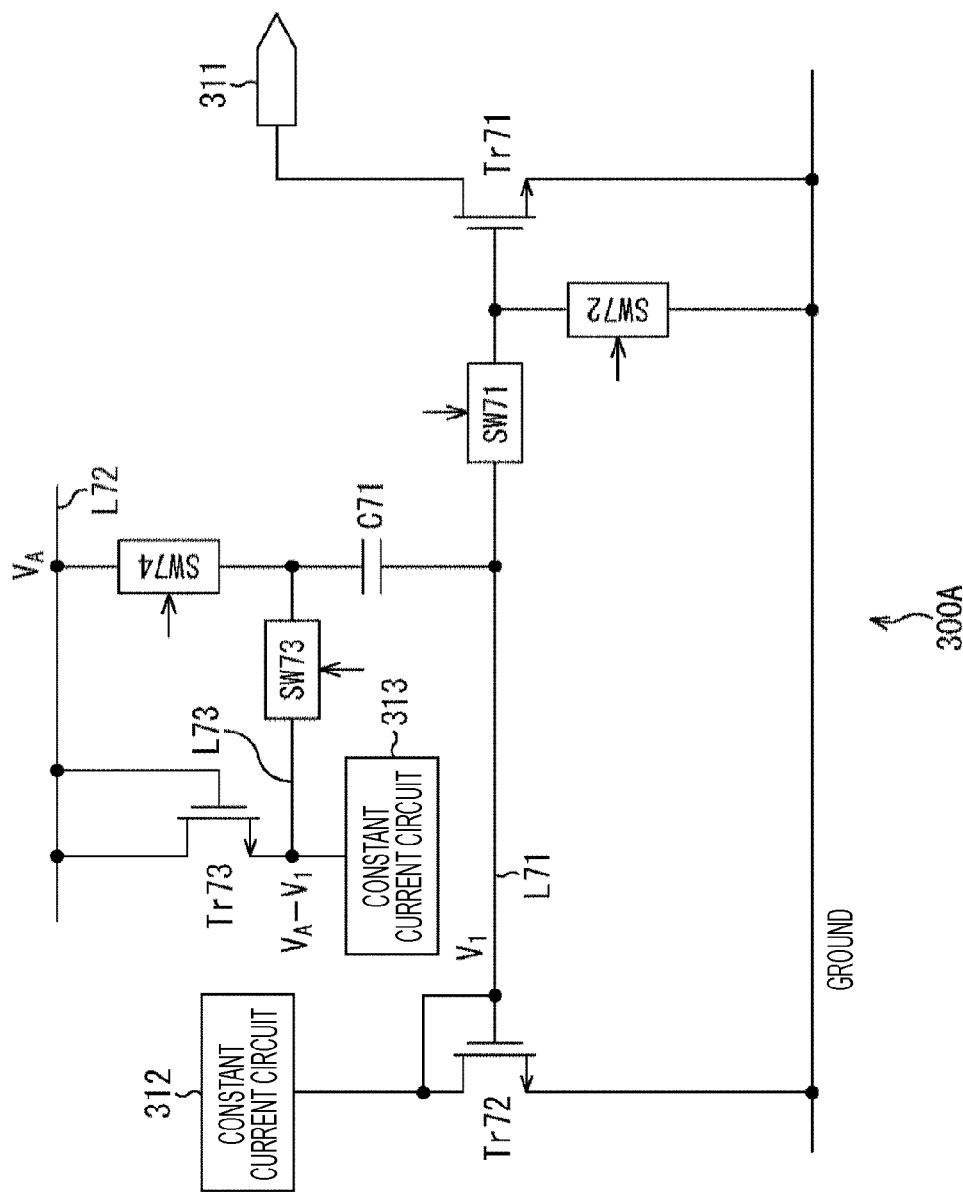
FIG. 13 is a circuit diagram illustrating an example of a first configuration of a charge pump circuit according to a third embodiment.

FIG. 13 is a circuit diagram illustrating an example of a first configuration of a charge pump circuit according to the third embodiment.

In FIG. 13, the sink-type charge pump circuit 300A is basically configured similarly to the sink-type charge pump circuit 200A (FIG. 7), but differs in that the sink-type charge pump circuit 300A includes a potential generation means.

That is, in the sink-type charge pump circuit 300A, as compared with the sink-type charge pump circuit 200A (FIG. 7), a constant current circuit 312 and a transistor Tr72 are provided instead of the input terminal 212, and a constant current circuit 313 and a transistor Tr73 are provided instead of the input terminal 213.

The transistors Tr72 and Tr73 are configured as, for example, N-type MOS transistors. Note that, in FIG. 13, an output terminal 311 corresponds to the output terminal 211 (FIG. 7), and signal lines L71 to L73 correspond to the signal lines L41 to L43 (FIG. 7).

The transistor Tr72 has the gate and drain connected to the constant current circuit 312, and the source connected to the ground node. Furthermore, the gate of the transistor Tr72 is connected to the signal line L71. By supplying a constant current to the drain side of the transistor Tr72 by the constant current circuit 312, the voltage $V_1$ can be applied to the signal line L71.

The transistor Tr73 has the gate and drain connected to the signal line L72 to which the voltage $V_A$ is applied, and the constant current circuit 313 is connected to the source side. By supplying a constant current to the source side of the transistor Tr73 by the constant current circuit 313, the voltage $V_A-V_1$ that is the difference voltage between the voltage $V_A$ and the voltage $V_1$ can be applied to the signal line L73.

Note that, in the sink-type charge pump circuit 300A, a current source transistor Tr71, switches SW71 to SW74, and capacitance C71 are configured similarly to the current source transistor Tr41, the switches SW41 to SW44, and the capacitance C41 of the sink-type charge pump circuit 200A (FIG. 7), so that the descriptions thereof are omitted.

(Operation of First Configuration)

Figure 14:
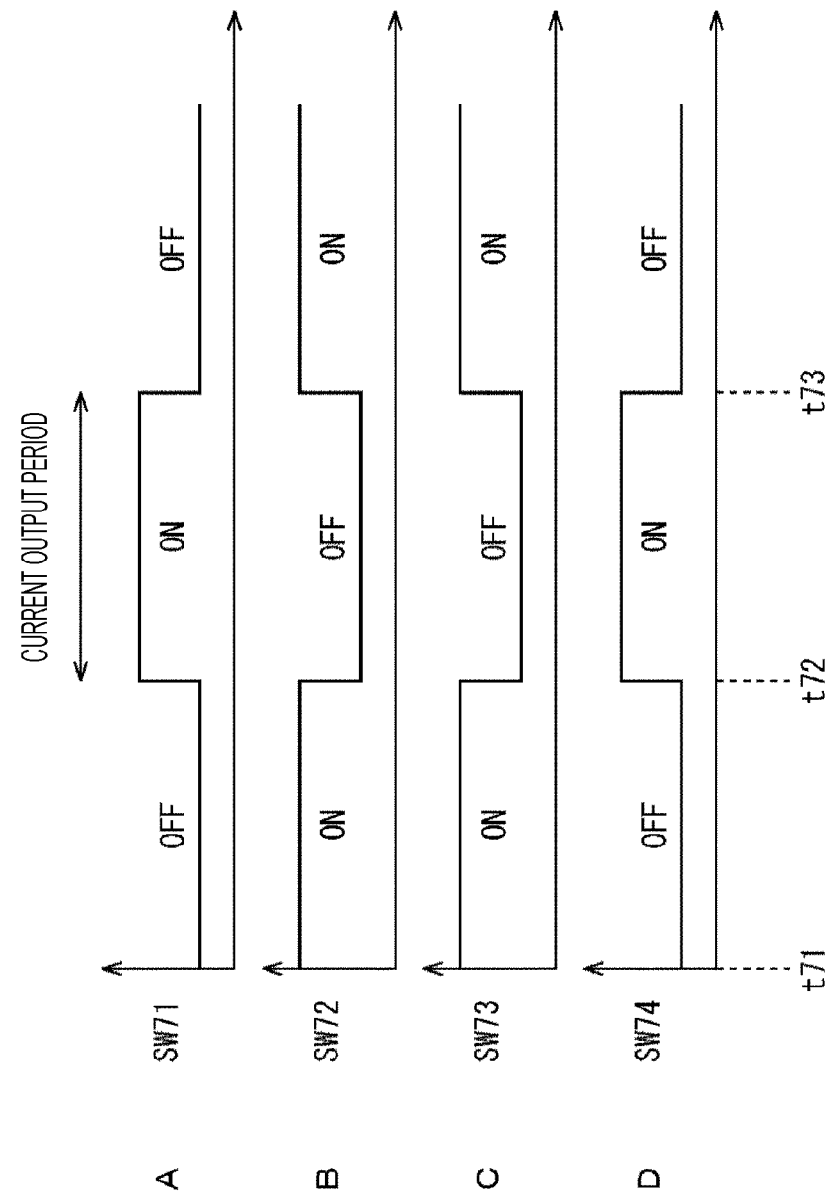
FIG. 14 is a timing chart illustrating operation of switches in the example of the first configuration of the charge pump circuit according to the third embodiment.

FIG. 14 is a timing chart for explaining operation of the charge pump circuit 300A of FIG. 13. Switching operation of the switches SW71 to SW74 of the charge pump circuit 300A is similar to the operation of the switches SW41 to SW44 of the charge pump circuit 200A (FIG. 7) illustrated in the timing chart of FIG. 8, so that the description thereof is omitted here.

As described above, in the sink-type charge pump circuit 300A, when the charge canceling mechanism is provided, the constant current is supplied from the constant current circuit 313 to the transistor Tr73 whose gate and drain are connected to the arbitrary voltage $V_A$ so that the current density is equal to that of the transistor Tr72 forming the current mirror, whereby the potential ($V_A-V_1$) can be generated, and a desired potential can be obtained with a simple circuit configuration (very few elements).

(Circuit Diagram of Second Configuration)

Figure 15:
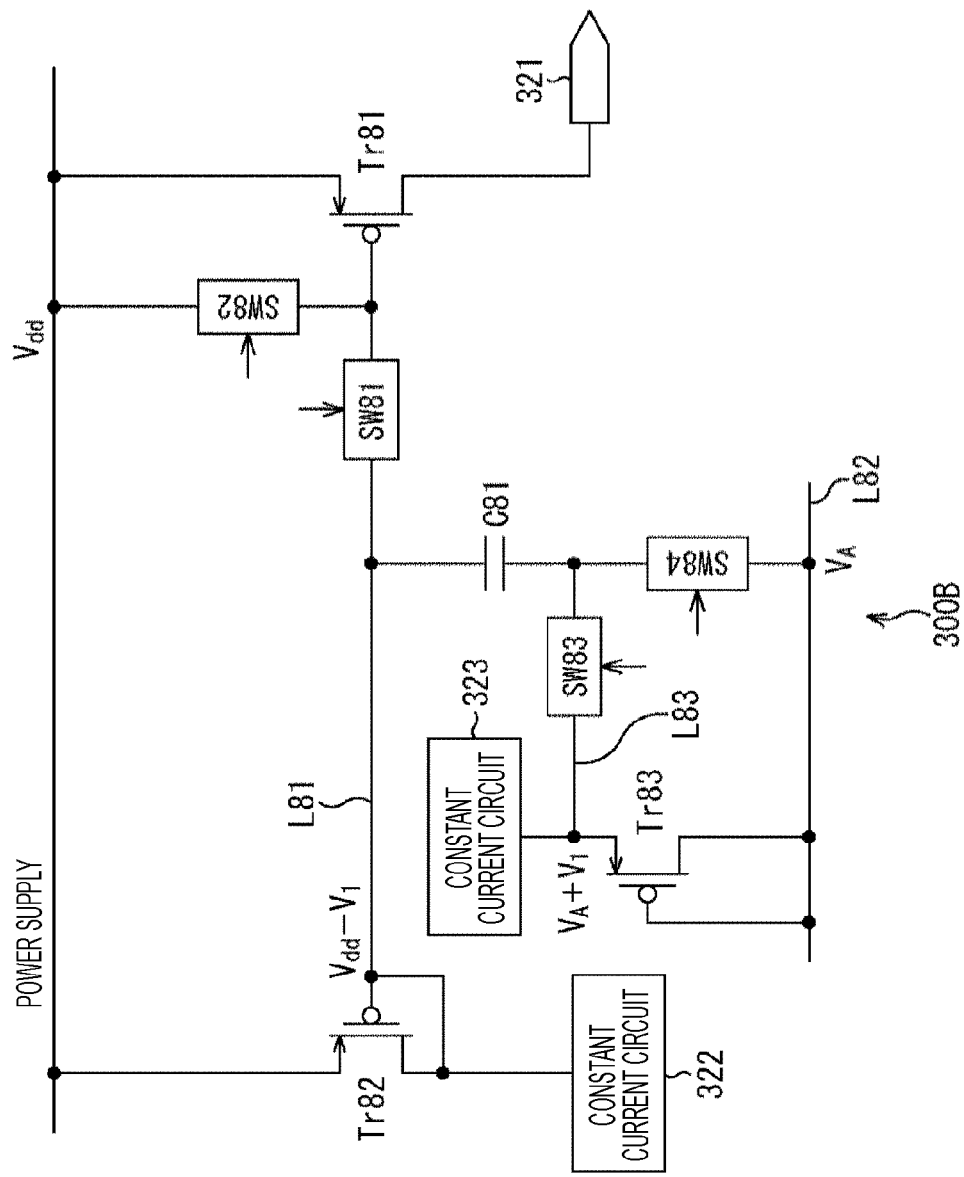
FIG. 15 is a circuit diagram illustrating an example of a second configuration of the charge pump circuit according to the third embodiment.

FIG. 15 is a circuit diagram illustrating an example of a second configuration of the charge pump circuit according to the third embodiment.

In FIG. 15, the source-type charge pump circuit 300B is basically configured similarly to the source-type charge pump circuit 200B (FIG. 9), but differs in that the source-type charge pump circuit 300B includes a potential generation means.

That is, in the source-type charge pump circuit 300B, as compared with the source-type charge pump circuit 200B (FIG. 9), a constant current circuit 322 and a transistor Tr82 are provided instead of the input terminal 222, and a constant current circuit 323 and a transistor Tr83 are provided instead of the input terminal 223.

The transistors Tr82 and Tr83 are configured as, for example, P-type MOS transistors. Furthermore, in FIG. 15, an output terminal 321 corresponds to the output terminal 221 (FIG. 9), and signal lines L81 to L83 correspond to the signal lines L51 to L53 (FIG. 9).

The transistor Tr82 has the gate and drain connected to the constant current circuit 322, and the source connected to the power supply node. Furthermore, the gate of the transistor Tr82 is connected to the signal line L81. By supplying a constant current to the drain side of the transistor Tr82 by the constant current circuit 322, the voltage $V_{dd}-V_1$ can be applied to the signal line L81.

The transistor Tr83 has the gate and drain connected to the signal line L82 to which the voltage $V_A$ is applied, and the constant current circuit 323 is connected to the source side. By supplying a constant current to the source side of the transistor Tr83 by the constant current circuit 323, the voltage $V_A+V_1$ that is the sum of the voltage $V_A$ and the voltage $V_1$ can be applied to the signal line L83.

Note that, in the source-type charge pump circuit 300B, a current source transistor Tr81, switches SW81 to SW84, and capacitance C81 are configured similarly to the current source transistor Tr51, the switches SW51 to SW54, and the capacitance C51 of the source-type charge pump circuit 200B (FIG. 9), so that the descriptions thereof are omitted.

(Operation of Second Configuration)

Figure 16:
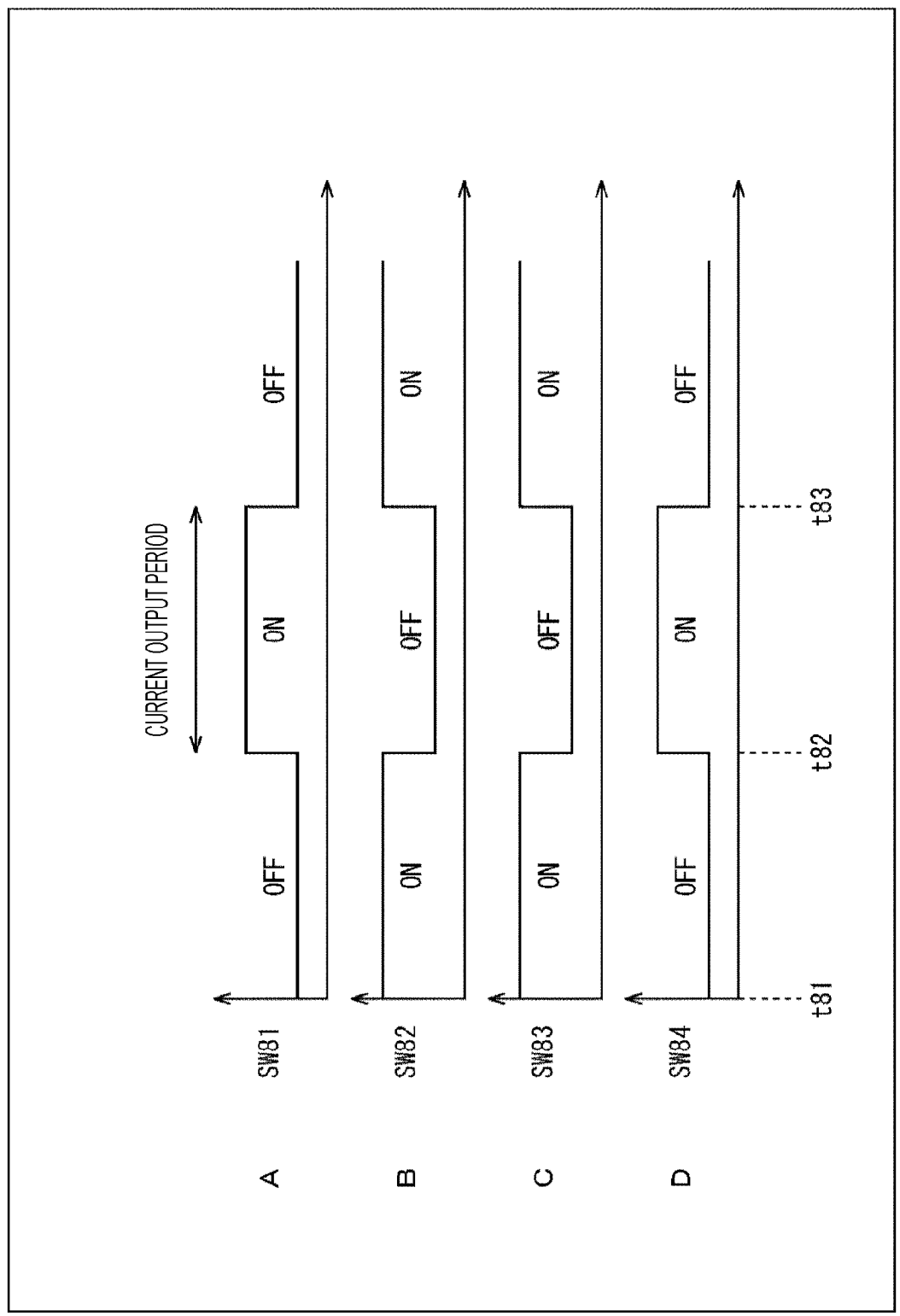
FIG. 16 is a timing chart illustrating operation of switches in the example of the second configuration of the charge pump circuit according to the third embodiment.

FIG. 16 is a timing chart for explaining operation of the charge pump circuit 300B of FIG. 15. Switching operation of the switches SW81 to SW84 of the charge pump circuit 300B is similar to the operation of the switches SW51 to SW54 of the charge pump circuit 200B (FIG. 9) illustrated in the timing chart of FIG. 10, so that the description thereof is omitted here.

In the above, the configuration and operation have been described of the source-type charge pump circuit 300B.

(Circuit Diagram of Third Configuration)

Figure 17:
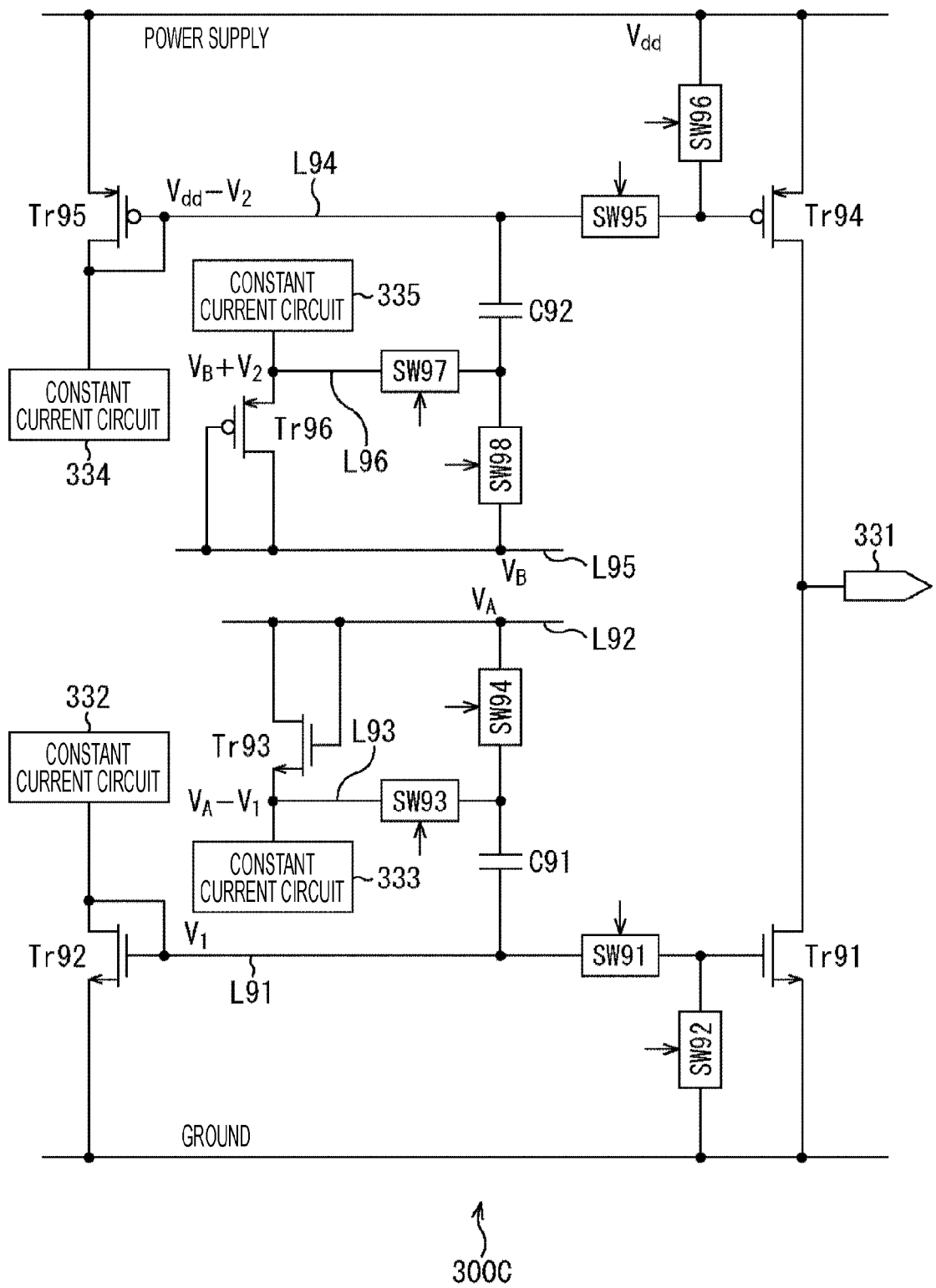
FIG. 17 is a circuit diagram illustrating an example of a third configuration of the charge pump circuit according to the third embodiment.

FIG. 17 is a circuit diagram illustrating an example of a third configuration of the charge pump circuit according to the third embodiment.

In FIG. 17, the sink/source integrated-type charge pump circuit 300C is basically configured similarly to the sink/source integrated-type charge pump circuit 200C (FIG. 11), but differs in that the sink/source integrated-type charge pump circuit 300C includes a potential generation means.

That is, in the sink/source integrated-type charge pump circuit 300C, as compared with the sink/source integrated-type charge pump circuit 200C (FIG. 11), a constant current circuit 332 and a transistor Tr92, and a constant current circuit 333 and a transistor Tr93 are provided respectively instead of the input terminal 232 and the input terminal 233 on the sink-type side.

Furthermore, a constant current circuit 334 and a transistor Tr95, and a constant current circuit 335 and a transistor Tr96 are provided respectively instead of the input terminal 234 and the input terminal 235 on the source-type side. Moreover, in FIG. 17, an output terminal 331 corresponds to the output terminal 231 (FIG. 11), and signal lines L91 to L93 on the sink-type side and signal lines L94 to L96 on the source-type side respectively correspond to the signal lines L61 to L63 on the sink-type side (FIG. 11) and the signal lines L64 to L66 on the source-type side (FIG. 11).

The transistor Tr92 on the sink-type side has the gate and drain connected to the constant current circuit 332, and the source connected to the ground node. Furthermore, the gate of the transistor Tr92 is connected to the signal line L91. By supplying a constant current to the drain side of the transistor Tr92 by the constant current circuit 332, the voltage $V_1$ can be applied to the signal line L91.

The transistor Tr93 on the sink-type side has the gate and drain connected to the signal line L92 to which the voltage $V_A$ is applied, and the constant current circuit 333 is connected to the source side. By supplying a constant current to the source side of the transistor Tr93 by the constant current circuit 333, the voltage $V_A - V_1$ that is the difference voltage between the voltage $V_A$ and the voltage $V_1$ can be applied to the signal line L93.

The transistor Tr95 on the source-type side has the gate and drain connected to the constant current circuit 334, and the source connected to the power supply node. Furthermore, the gate of the transistor Tr95 is connected to the signal line L94. By supplying a constant current to the drain side of the transistor Tr95 by the constant current circuit 334, the voltage $V_{dd} - V_2$ can be applied to the signal line L94.

The transistor Tr96 has the gate and drain connected to the signal line L95 to which the voltage $V_B$ is applied, and the constant current circuit 335 is connected to the source side. By supplying a constant current to the source side of the transistor Tr96 by the constant current circuit 335, the voltage $V_B + V_2$ that is a sum of the voltage $V_B$ and the voltage $V_2$ can be applied to the signal line L96.

Note that, in the sink/source integrated-type charge pump circuit 300C, a current source transistor Tr91, switches SW91 to SW94, and capacitance C91 on the sink-type side, and a current source transistor Tr94, switches SW95 to SW98, and capacitance C92 on the source-type side are configured similarly to the current source transistor Tr61, the switches SW61 to SW64, and the capacitance C61 on the sink-type side, and the current source transistor Tr62, the switches SW65 to SW68, and the capacitance C62 on the source-type side of the sink/source integrated-type charge pump circuit 200C (FIG. 11), so that the descriptions thereof are omitted.

(Operation of Third Configuration)

FIG. 18 is a timing chart for explaining operation of the charge pump circuit 300C of FIG. 17. Switching operation of the switches SW91 to SW98 of the charge pump circuit 300C is similar to the operation of the switches SW61 to SW68 of the charge pump circuit 200C (FIG. 11) illustrated in the timing chart of FIG. 12, so that the description thereof is omitted here.

In the above, the configuration and operation have been described of the sink/source integrated-type charge pump circuit 300C.

4. Fourth Embodiment (Example of Configuration)

FIG. 19 is a diagram illustrating an example of a configuration of an electronic circuit system according to a fourth embodiment.

In FIG. 19, an electronic circuit system 1 includes a control circuit 10 and the charge pump circuit 100. However, here, although the charge pump circuit 100 will be described as an example, the charge pump circuit 200 or the charge pump circuit 300 may be provided instead of the charge pump circuit 100.

In the electronic circuit system 1, the control circuit 10 and the charge pump circuit 100 are connected to each other via control lines L1 to Li (i: an integer greater than or equal to 1). For example, in the charge pump circuit 100, the control lines L1 to Li are connected to switches SW (for example, the switches SW11 to SW14 of FIG. 1).

The control circuit 10 generates control signals (for example, control signals of the H level or the L level) for controlling the switches SW of the charge pump circuit 100, and supplies the control signals to the charge pump circuit 100 via the control lines L1 to Li. In the charge pump circuit 100, the switches SW perform switching operation on the basis of the control signals from the control circuit 10 outside, whereby the charge pump circuit 100 operates as a current sink for current discharge, or as a current source that supplies a charging current.

5. Modification

The charge pump circuits (100, 200, 300) of the first to third embodiments described above can be mounted on, for example, a Phase Locked Loop (PLL) circuit, a Digital to Analog Converter (DAC) having a configuration of switching a current source, and the like.

Here, for example, a case is assumed where the charge pump circuit 100 (200, 300) is mounted on a PLL circuit including a phase comparator (PC), a charge pump circuit, a low pass filter (LPF), and a voltage controlled oscillator (VCO).

In this case, the charge pump circuit 100 (200, 300) performs charge pump operation on the basis of an output pulse from the phase comparator provided at the preceding stage. An output of the charge pump circuit 100 (200, 300) is output to the low pass filter including a capacitor charged or discharged by the charge pump circuit 100 (200, 300). Note that, a voltage of the capacitor of the low pass filter is applied as an input to the voltage controlled oscillator. Furthermore, the phase comparator compares a phase of an input signal with a phase of an output of the voltage controlled oscillator.

Note that, if such a PLL circuit is regarded as the electronic circuit system 1 (FIG. 19) described above, it can also be said that the phase comparator provided before the charge pump circuit 100 (200, 300) corresponds to the control circuit 10 (FIG. 19), and inputs the control signals to the charge pump circuit 100 (200, 300).

Note that, the embodiment of the present technology is not limited to the embodiments described above, and various modifications are possible without departing from the scope of the present technology.

Furthermore, the present technology can have a configuration as follows.

(1)

A charge pump circuit including:

a first transistor including a first terminal, a second terminal connected to an output terminal, and a control terminal;

a second transistor including a first terminal, a second terminal to which a constant current is supplied, and a control terminal connected to the second terminal;

a third transistor including a first terminal connected to the first terminal of the first transistor, a second terminal connected to a voltage source that supplies an arbitrary voltage, and a control terminal;

a fourth transistor group including N transistors arranged in a cascade on a first terminal side of the first transistor, where N is an integer greater than or equal to 1, the N transistors all including control terminals connected to the control terminal of the second transistor;

a fifth transistor group including N transistors arranged in a cascade on a first terminal side of the second transistor, the N transistors all including control terminals connected to the control terminal of the second transistor;

a first switch element that electrically connects the control terminal of the first transistor to the control terminal of the second transistor;

a second switch element that connects the control terminal of the first transistor to a ground node;

a third switch element that electrically connects the control terminal of the third transistor to the control terminals of the fourth transistor group and the fifth transistor group; and a fourth switch element that connects the control terminal of the third transistor to the ground node, in which the first transistor has a channel width and a channel length identical to those of the second transistor, the third transistor has the channel width and the channel length identical to those of the first transistor and the second transistor, in the fourth transistor group, each of the transistors has the channel width and the channel length identical to those of the second transistor, and a first terminal of one of the transistors is connected to the ground node, and in the fifth transistor group, each of the transistors has the channel width and the channel length identical to those of the second transistor, and a first terminal of one of the transistors is connected to the ground node.

(2)

The charge pump circuit according to (1), in which during a current output period that is a period in which a current is output, the first switch element and the fourth switch element are turned on, and the second switch element and the third switch element are turned off, and during a period excluding the current output period, the first switch element and the fourth switch element are turned off, and the second switch element and the third switch element are turned on.

(3)

The charge pump circuit according to (1) or (2), further including a capacitance element including one electrode connected to a signal line between the control terminal of the second transistor and the first switch element, and another electrode connected to the ground node.

(4)

A charge pump circuit including:

a first transistor including a first terminal, a second terminal connected to an output terminal, and a control terminal;

a second transistor including a first terminal, a second terminal to which a constant current is supplied, and a control terminal connected to the second terminal;

a third transistor including a first terminal connected to the first terminal of the first transistor, a second terminal connected to a voltage source that supplies an arbitrary voltage, and a control terminal;

a fourth transistor group including N transistors arranged in a cascade on a first terminal side of the first transistor, where N is an integer greater than or equal to 1, the N transistors all including control terminals connected to the control terminal of the second transistor;

a fifth transistor group including N transistors arranged in a cascade on a first terminal side of the second transistor, the N transistors all including control terminals connected to the control terminal of the second transistor;

a first switch element that electrically connects the control terminal of the first transistor to the control terminal of the second transistor;

a second switch element that connects the control terminal of the first transistor to a power supply node;

a third switch element that electrically connects the control terminal of the third transistor to the control terminals of the fourth transistor group and the fifth transistor group; and a fourth switch element that connects the control terminal of the third transistor to the power supply node, in which the first transistor has a channel width and a channel length identical to those of the second transistor, the third transistor has the channel width and the channel length identical to those of the first transistor and the second transistor, in the fourth transistor group, each of the transistors has the channel width and the channel length identical to those of the second transistor, and a first terminal of one of the transistors is connected to the power supply node, and in the fifth transistor group, each of the transistors has the channel width and the channel length identical to those of the second transistor, and a first terminal of one of the transistors is connected to the power supply node.

(5)

The charge pump circuit according to (4), in which during a current output period that is a period in which a current is output, the first switch element and the fourth switch element are turned on, and the second switch element and the third switch element are turned off, and during a period excluding the current output period, the first switch element and the fourth switch element are turned off, and the second switch element and the third switch element are turned on.

(6)

The charge pump circuit according to (4) or (5), further including a capacitance element including one electrode connected to a signal line between the control terminal of the second transistor and the first switch element, and another electrode connected to the power supply node.

(7)

A charge pump circuit including:

a first transistor including a first terminal, a second terminal connected to an output terminal, and a control terminal;

a second transistor including a first terminal, a second terminal to which a first constant current is supplied, and a control terminal connected to the second terminal;

a third transistor including a first terminal connected to the first terminal of the first transistor, a second terminal connected to a first voltage source that supplies a first voltage, and a control terminal;

a fourth transistor group including N transistors arranged in a cascade on a first terminal side of the first transistor, where N is an integer greater than or equal to 1, the N transistors all including control terminals connected to the control terminal of the second transistor;

a fifth transistor group including N transistors arranged in a cascade on a first terminal side of the second transistor, the N transistors all including control terminals connected to the control terminal of the second transistor;

a first switch element that electrically connects the control terminal of the first transistor to the control terminal of the second transistor;

a second switch element that connects the control terminal of the first transistor to a ground node;

a third switch element that electrically connects the control terminal of the third transistor to the control terminals of the fourth transistor group and the fifth transistor group;

a fourth switch element that connects the control terminal of the third transistor to the ground node;

a sixth transistor including a first terminal, a second terminal connected to the output terminal, and a control terminal;

a seventh transistor including a first terminal, a second terminal to which a second constant current is supplied, and a control terminal connected to the second terminal;

an eighth transistor including a first terminal connected to the first terminal of the sixth transistor, a second terminal connected to a second voltage source that supplies a second voltage, and a control terminal;

a ninth transistor group including M transistors arranged in a cascade on a first terminal side of the sixth transistor, where M is an integer greater than or equal to 1, the M transistors all including control terminals connected to the control terminal of the seventh transistor;

a tenth transistor group including M transistors arranged in a cascade on a first terminal side of the seventh transistor, the M transistors all including control terminals connected to the control terminal of the seventh transistor;

a fifth switch element that electrically connects the control terminal of the sixth transistor to the control terminal of the seventh transistor;

a sixth switch element that connects the control terminal of the sixth transistor to a power supply node;

a seventh switch element that electrically connects the control terminal of the eighth transistor to the control terminals of the ninth transistor group and the tenth transistor group; and an eighth switch element that connects the control terminal of the eighth transistor to the power supply node, in which the first transistor has a channel width and a channel length identical to those of the second transistor, the third transistor has the channel width and the channel length identical to those of the first transistor and the second transistor, in the fourth transistor group, each of the transistors has the channel width and the channel length identical to those of the second transistor, and a first terminal of one of the transistors is connected to the ground node, in the fifth transistor group, each of the transistors has the channel width and the channel length identical to those of the second transistor, and a first terminal of one of the transistors is connected to the ground node, the sixth transistor has a channel width and a channel length identical to those of the seventh transistor, the eighth transistor has the channel width and the channel length identical to those of the sixth transistor and the seventh transistor, in the ninth transistor group, each of the transistors has the channel width and the channel length identical to those of the seventh transistor, and a first terminal of one of the transistors is connected to the power supply node, and in the tenth transistor group, each of the transistors has the channel width and the channel length identical to those of the seventh transistor, and a first terminal of one of the transistors is connected to the power supply node.

(8)

The charge pump circuit according to (7), in which during a first current output period that is a period in which a current is output when the current is sunk, the first switch element and the fourth switch element are turned on, and the second switch element and the third switch element are turned off, during a period excluding the first current output period, the first switch element and the fourth switch element are turned off, and the second switch element and the third switch element are turned on, during a second current output period that is a period in which a current is output when the current is supplied, the fifth switch element and the eighth switch element are turned on, and the sixth switch element and the seventh switch element are turned off, and during a period excluding the second current output period, the fifth switch element and the eighth switch element are turned off, and the sixth switch element and the seventh switch element are turned on.

(9)

The charge pump circuit according to (7) or (8), further including:

a first capacitance element including one electrode connected to a signal line between the control terminal of the second transistor and the first switch element, and another electrode connected to the ground node; and a second capacitance element including one electrode connected to a signal line between the control terminal of the seventh transistor and the fifth switch element, and another electrode connected to the power supply node.

(10)

The charge pump circuit according to any of (7) to (9), in which the first transistor, the second transistor, the third transistor, the fourth transistor group, and the fifth transistor group include an N-type MOS transistor, the sixth transistor, the seventh transistor, the eighth transistor, the ninth transistor group, and the tenth transistor group include a P-type MOS transistor, and the first terminal includes a source, the second terminal includes a drain, and the control terminal includes a gate.

(11)

A charge pump circuit including:

a current source transistor including a first terminal connected to a ground node, a second terminal connected to an output terminal, and a control terminal;

a first switch element that connects the control terminal of the current source transistor to a first signal line to which a first voltage is applied;

a second switch element that connects the control terminal of the current source transistor to the ground node;

a capacitance element including one electrode connected to the first signal line, and another electrode connectable to a second signal line to which a second voltage is applied or a third signal line to which a difference voltage between the second voltage and the first voltage is applied;

a third switch element that connects the other electrode of the capacitance element to the third signal line; and a fourth switch element that connects the other electrode of the capacitance element to the second signal line.

(12)

The charge pump circuit according to (11), in which during a current output period that is a period in which a current is output, the first switch element and the fourth switch element are turned on, and the second switch element and the third switch element are turned off, and during a period excluding the current output period, the first switch element and the fourth switch element are turned off, and the second switch element and the third switch element are turned on.

(13)

The charge pump circuit according to (11) or (12), further including a transistor including a first terminal, and a second terminal and a control terminal connected to the second signal line, in which the difference voltage is applied to the third signal line by supplying a constant current to a first terminal side of the transistor.

(14)

A charge pump circuit including:

a current source transistor including a first terminal connected to a power supply node, a second terminal connected to an output terminal, and a control terminal;

a first switch element that connects the control terminal of the current source transistor to a first signal line to which a difference voltage between a power supply voltage and a first voltage is applied;

a second switch element that connects the control terminal of the current source transistor to the power supply node;

a capacitance element including one electrode connected to the first signal line, and another electrode connectable to a second signal line to which a second voltage is applied or a third signal line to which a sum voltage of the second voltage and the first voltage is applied;

a third switch element that connects the other electrode of the capacitance element to the third signal line; and a fourth switch element that connects the other electrode of the capacitance element to the second signal line.

(15)

The charge pump circuit according to (14), in which during a current output period that is a period in which a current is output, the first switch element and the fourth switch element are turned on, and the second switch element and the third switch element are turned off, and during a period excluding the current output period, the first switch element and the fourth switch element are turned off, and the second switch element and the third switch element are turned on.

(16)

The charge pump circuit according to (14) or (15), further including a transistor including a first terminal, and a second terminal and a control terminal connected to the second signal line, in which the sum voltage is applied to the third signal line by supplying a constant current to a first terminal side of the transistor.

(17)

A charge pump circuit including:

a first transistor including a first terminal connected to a ground node, a second terminal connected to an output terminal, and a control terminal;

a first switch element that connects the control terminal of the first transistor to a first signal line to which a first voltage is applied;

a second switch element that connects the control terminal of the first transistor to the ground node;

a first capacitance element including one electrode connected to the first signal line, and another electrode connectable to a second signal line to which a second voltage is applied or a third signal line to which a difference voltage between the second voltage and the first voltage is applied;

a third switch element that connects the other electrode of the first capacitance element to the third signal line;

a fourth switch element that connects the other electrode of the first capacitance element to the second signal line;

a second transistor including a first terminal connected to a power supply node, a second terminal connected to the output terminal, and a control terminal;

a fifth switch element that connects the control terminal of the second transistor to a fourth signal line to which a difference voltage between a power supply voltage and a third voltage is applied;

a sixth switch element that connects the control terminal of the second transistor to the power supply node;

a second capacitance element including one electrode connected to the fourth signal line, and another electrode connectable to a fifth signal line to which a fourth voltage is applied or a sixth signal line to which a sum voltage of the fourth voltage and the third voltage is applied;

a seventh switch element that connects the other electrode of the second capacitance element to the sixth signal line; and an eighth switch element that connects the other electrode of the second capacitance element to the fifth signal line.

(18)

The charge pump circuit according to (17), in which during a first current output period that is a period in which a current is output when the current is sunk, the first switch element and the fourth switch element are turned on, and the second switch element and the third switch element are turned off, during a period excluding the first current output period, the first switch element and the fourth switch element are turned off, and the second switch element and the third switch element are turned on, during a second current output period that is a period in which a current is output when the current is supplied, the fifth switch element and the eighth switch element are turned on, and the sixth switch element and the seventh switch element are turned off, and during a period excluding the second current output period, the fifth switch element and the eighth switch element are turned off, and the sixth switch element and the seventh switch element are turned on.

(19)

The charge pump circuit according to (17) or (18), further including:

a third transistor including a first terminal, and a second terminal and a control terminal connected to the second signal line; and a fourth transistor including a first terminal, and a second terminal and a control terminal connected to the fifth signal line, in which the difference voltage is applied to the third signal line by supplying a first constant current to a first terminal side of the third transistor, and the sum voltage is applied to the sixth signal line by supplying a second constant current to a first terminal side of the fourth transistor.

(20)

The charge pump circuit according to (19), in which the first transistor includes an N-type MOS transistor, the second transistor includes a P-type MOS transistor,
the third transistor includes an N-type MOS transistor,
the fourth transistor includes a P-type MOS transistor, and
the first terminal includes a source, the second terminal includes a drain, and the control terminal includes a gate.

REFERENCE SIGNS LIST

1 Electronic circuit system
10 Control circuit
100, 100A, 100B, 100C Charge pump circuit
111 Constant current circuit
112 Output terminal
121 Constant current circuit
122 Output terminal
131, 132 Constant current circuit
133 Output terminal
200, 200A, 200B, 200C Charge pump circuit
211 Output terminal
212, 213 Input terminal
221 Output terminal
222, 223 Input terminal
231 Output terminal
232 to 234 Input terminal
300, 300A, 300B, 300C Charge pump circuit
311 Output terminal
312, 313 Constant current circuit
321 Output terminal
322, 323 Constant current circuit
331 Output terminal
332 to 335 Constant current circuit
C11 Capacitance
SW11 to SW14 Switch
TR11, TR12, TR13, TR14-1 to TR14-N, TR15-1 to TR15-N Transistor
C21 Capacitance
SW21 to SW24 Switch
TR21, TR22, TR23, TR24-1 to TR24-N, TR25-1 to TR25-N Transistor
C31, C32 Capacitance
SW31 to SW38 Switch
TR31, TR32, TR33, TR34-1 to TR34-N, TR35-1 to TR35-N,
TR36, TR37, TR38, TR39-1 to TR39-M, TR310-1 to TR310-M Transistor
C41 Capacitance
L41 to L43 Signal line
SW41 to SW44 Switch
TR41 Current source transistor
C51 Capacitance
L51 to L53 Signal line
SW51 to SW54 Switch
TR51 Current source transistor
C61, C62 Capacitance
L61 to L66 Signal line
SW61 to SW68 Switch
TR61, TR62 Current source transistor
C71 Capacitance
L71 to L73 Signal line
SW71 to SW74 Switch
TR71 Current source transistor
TR72, TR73 Transistor
C81 Capacitance
L81 to L83 Signal line
SW81 to SW84 Switch
TR81 Current source transistor
TR82, TR83 Transistor
C91, C92 Capacitance
L91 to L96 Signal line
SW91 to SW98 Switch
TR91, TR94 Current source transistor
TR92, TR93, TR95, TR96 Current source transistor

The invention claimed is:

1. A charge pump circuit comprising:
    a first transistor including a first terminal, a second terminal connected to an output terminal, and a control terminal;
    a second transistor including a first terminal, a second terminal to which a constant current is supplied, and a control terminal connected to the second terminal;
    a third transistor including a first terminal connected to the first terminal of the first transistor, a second terminal connected to a voltage source that supplies an arbitrary voltage, and a control terminal;
    a fourth transistor group including N transistors arranged in a cascade on a first terminal side of the first transistor, where N is an integer greater than or equal to 1, the N transistors all including control terminals connected to the control terminal of the second transistor;
    a fifth transistor group including N transistors arranged in a cascade on a first terminal side of the second transistor, the N transistors all including control terminals connected to the control terminal of the second transistor;
    a first switch element that electrically connects the control terminal of the first transistor to the control terminal of the second transistor;
    a second switch element that connects the control terminal of the first transistor to a ground node;
    a third switch element that electrically connects the control terminal of the third transistor to the control terminals of the fourth transistor group and the fifth transistor group; and
    a fourth switch element that connects the control terminal of the third transistor to the ground node, wherein
    the first transistor has a channel width and a channel length identical to those of the second transistor,
    the third transistor has the channel width and the channel length identical to those of the first transistor and the second transistor,
    in the fourth transistor group, each of the transistors has the channel width and the channel length identical to those of the second transistor, and a first terminal of one of the transistors is connected to the ground node, and
    in the fifth transistor group, each of the transistors has the channel width and the channel length identical to those of the second transistor, and a first terminal of one of the transistors is connected to the ground node.

2. The charge pump circuit according to claim 1, wherein during a current output period that is a period in which a current is output, the first switch element and the fourth switch element are turned on, and the second switch element and the third switch element are turned off, and during a period excluding the current output period, the first switch element and the fourth switch element are turned off, and the second switch element and the third switch element are turned on.

3. The charge pump circuit according to claim 1, further comprising a capacitance element including one electrode connected to a signal line between the control terminal of the second transistor and the first switch element, and another electrode connected to the ground node.

4. A charge pump circuit comprising:

a first transistor including a first terminal, a second terminal connected to an output terminal, and a control terminal;

a second transistor including a first terminal, a second terminal to which a constant current is supplied, and a control terminal connected to the second terminal;

a third transistor including a first terminal connected to the first terminal of the first transistor, a second terminal connected to a voltage source that supplies an arbitrary voltage, and a control terminal;

a fourth transistor group including N transistors arranged in a cascade on a first terminal side of the first transistor, where N is an integer greater than or equal to 1, the N transistors all including control terminals connected to the control terminal of the second transistor;

a fifth transistor group including N transistors arranged in a cascade on a first terminal side of the second transistor, the N transistors all including control terminals connected to the control terminal of the second transistor;

a first switch element that electrically connects the control terminal of the first transistor to the control terminal of the second transistor;

a second switch element that connects the control terminal of the first transistor to a power supply node;

a third switch element that electrically connects the control terminal of the third transistor to the control terminals of the fourth transistor group and the fifth transistor group; and a fourth switch element that connects the control terminal of the third transistor to the power supply node, wherein the first transistor has a channel width and a channel length identical to those of the second transistor, the third transistor has the channel width and the channel length identical to those of the first transistor and the second transistor, in the fourth transistor group, each of the transistors has the channel width and the channel length identical to those of the second transistor, and a first terminal of one of the transistors is connected to the power supply node, and in the fifth transistor group, each of the transistors has the channel width and the channel length identical to those of the second transistor, and a first terminal of one of the transistors is connected to the power supply node.

5. The charge pump circuit according to claim 4, wherein during a current output period that is a period in which a current is output, the first switch element and the fourth switch element are turned on, and the second switch element and the third switch element are turned off, and during a period excluding the current output period, the first switch element and the fourth switch element are turned off, and the second switch element and the third switch element are turned on.

6. The charge pump circuit according to claim 4, further comprising a capacitance element including one electrode connected to a signal line between the control terminal of the second transistor and the first switch element, and another electrode connected to the power supply node.

7. A charge pump circuit comprising:

a first transistor including a first terminal, a second terminal connected to an output terminal, and a control terminal;

a second transistor including a first terminal, a second terminal to which a first constant current is supplied, and a control terminal connected to the second terminal;

a third transistor including a first terminal connected to the first terminal of the first transistor, a second terminal connected to a first voltage source that supplies a first voltage, and a control terminal;

a fourth transistor group including N transistors arranged in a cascade on a first terminal side of the first transistor, where N is an integer greater than or equal to 1, the N transistors all including control terminals connected to the control terminal of the second transistor;

a fifth transistor group including N transistors arranged in a cascade on a first terminal side of the second transistor, the N transistors all including control terminals connected to the control terminal of the second transistor;

a first switch element that electrically connects the control terminal of the first transistor to the control terminal of the second transistor;

a second switch element that connects the control terminal of the first transistor to a ground node;

a third switch element that electrically connects the control terminal of the third transistor to the control terminals of the fourth transistor group and the fifth transistor group;

a fourth switch element that connects the control terminal of the third transistor to the ground node;

a sixth transistor including a first terminal, a second terminal connected to the output terminal, and a control terminal;

a seventh transistor including a first terminal, a second terminal to which a second constant current is supplied, and a control terminal connected to the second terminal;

an eighth transistor including a first terminal connected to the first terminal of the sixth transistor, a second terminal connected to a second voltage source that supplies a second voltage, and a control terminal;

a ninth transistor group including M transistors arranged in a cascade on a first terminal side of the sixth transistor, where M is an integer greater than or equal to 1, the M transistors all including control terminals connected to the control terminal of the seventh transistor;

a tenth transistor group including M transistors arranged in a cascade on a first terminal side of the seventh transistor, the M transistors all including control terminals connected to the control terminal of the seventh transistor;

a fifth switch element that electrically connects the control terminal of the sixth transistor to the control terminal of the seventh transistor;

a sixth switch element that connects the control terminal of the sixth transistor to a power supply node;

a seventh switch element that electrically connects the control terminal of the eighth transistor to the control terminals of the ninth transistor group and the tenth transistor group; and an eighth switch element that connects the control terminal of the eighth transistor to the power supply node, wherein the first transistor has a channel width and a channel length identical to those of the second transistor, the third transistor has the channel width and the channel length identical to those of the first transistor and the second transistor, in the fourth transistor group, each of the transistors has the channel width and the channel length identical to those of the second transistor, and a first terminal of one of the transistors is connected to the ground node, in the fifth transistor group, each of the transistors has the channel width and the channel length identical to those of the second transistor, and a first terminal of one of the transistors is connected to the ground node, the sixth transistor has a channel width and a channel length identical to those of the seventh transistor, the eighth transistor has the channel width and the channel length identical to those of the sixth transistor and the seventh transistor, in the ninth transistor group, each of the transistors has the channel width and the channel length identical to those of the seventh transistor, and a first terminal of one of the transistors is connected to the power supply node, and in the tenth transistor group, each of the transistors has the channel width and the channel length identical to those of the seventh transistor, and a first terminal of one of the transistors is connected to the power supply node.

8. The charge pump circuit according to claim 7, wherein during a first current output period that is a period in which a current is output when the current is sunk, the first switch element and the fourth switch element are turned on, and the second switch element and the third switch element are turned off, during a period excluding the first current output period, the first switch element and the fourth switch element are turned off, and the second switch element and the third switch element are turned on, during a second current output period that is a period in which a current is output when the current is supplied, the fifth switch element and the eighth switch element are turned on, and the sixth switch element and the seventh switch element are turned off, and during a period excluding the second current output period, the fifth switch element and the eighth switch element are turned off, and the sixth switch element and the seventh switch element are turned on.

9. The charge pump circuit according to claim 7, further comprising:

a first capacitance element including one electrode connected to a signal line between the control terminal of the second transistor and the first switch element, and another electrode connected to the ground node; and a second capacitance element including one electrode connected to a signal line between the control terminal of the seventh transistor and the fifth switch element, and another electrode connected to the power supply node.

10. The charge pump circuit according to claim 7, wherein the first transistor, the second transistor, the third transistor, the fourth transistor group, and the fifth transistor group include an N-type MOS transistor, the sixth transistor, the seventh transistor, the eighth transistor, the ninth transistor group, and the tenth transistor group include a P-type MOS transistor, and the first terminal includes a source, the second terminal includes a drain, and the control terminal includes a gate.

* * * * *